(12) United States Patent
Lee et al.

(10) Patent No.: US 10,128,252 B2
(45) Date of Patent: Nov. 13, 2018

(54) SEMICONDUCTOR DEVICE

(71) Applicant: Samsung Electronics Co., Ltd., Suwon-si, Gyeonggi-do (KR)

(72) Inventors: Ki-seok Lee, Hwaseong-si (KR); Dae-ik Kim, Hwaseong-si (KR); Yoo-sang Hwang, Suwon-si (KR); Bong-soo Kim, Yongin-si (KR); Je-min Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/646,540

(22) Filed: Jul. 11, 2017

(65) Prior Publication Data

US 2018/0175045 A1 Jun. 21, 2018

(30) Foreign Application Priority Data

Dec. 20, 2016 (KR) ........................ 10-2016-0174770

(51) Int. Cl.
| | |
|---|---|
| H01L 27/108 | (2006.01) |
| H01L 23/528 | (2006.01) |
| H01L 29/167 | (2006.01) |
| H01L 29/36 | (2006.01) |
| G11C 11/4091 | (2006.01) |
| G11C 11/408 | (2006.01) |
| H01L 29/423 | (2006.01) |

(52) U.S. Cl.
CPC .... *H01L 27/10897* (2013.01); *G11C 11/4085* (2013.01); *G11C 11/4091* (2013.01); *H01L 23/528* (2013.01); *H01L 27/10814* (2013.01); *H01L 27/10823* (2013.01); *H01L 29/167* (2013.01); *H01L 29/36* (2013.01); *H01L 29/42376* (2013.01)

(58) Field of Classification Search
CPC .... G11C 5/06; H01L 29/7813; H01L 29/1095
USPC .................................... 365/63; 257/330, 139
See application file for complete search history.

(56) References Cited

U.S. PATENT DOCUMENTS

| | | | |
|---|---|---|---|
| 8,309,412 | B2 | 11/2012 | Cho |
| 8,569,817 | B2 | 10/2013 | Kwon |
| 8,742,494 | B2 | 6/2014 | Wu |
| 8,865,547 | B2 | 10/2014 | Kang |
| 9,130,009 | B2 | 9/2015 | Manabe |
| 9,159,730 | B2 | 10/2015 | Kim et al. |

(Continued)

*Primary Examiner* — Michael Tran
(74) *Attorney, Agent, or Firm* — Harness, Dickey & Pierce, P.L.C.

(57) ABSTRACT

A semiconductor device includes a substrate including a cell active region and a peripheral active region, a direct contact arranged on a cell insulating pattern formed on the substrate and connected to the cell active region, a bit line structure including a thin conductive pattern, contacting a top surface of the direct contact and extending in one direction, and a peripheral gate structure in the peripheral active region. The peripheral gate structure include a stacked structure of a peripheral gate insulating pattern and a peripheral gate conductive pattern, the thin conductive pattern includes a first material and the peripheral gate conductive pattern include the first material, and a level of an upper surface of the thin conductive pattern is lower than a level of an upper surface of the peripheral gate conductive pattern.

17 Claims, 28 Drawing Sheets

(56) References Cited

U.S. PATENT DOCUMENTS

| | | | |
|---|---|---|---|
| 9,276,074 B2 | 3/2016 | Choi et al. | |
| 2003/0198086 A1* | 10/2003 | Shukuri | B82Y 10/00 |
| | | | 365/185.18 |
| 2012/0205733 A1* | 8/2012 | Kang | H01L 27/10852 |
| | | | 257/311 |
| 2012/0217576 A1* | 8/2012 | Yeo | H01L 27/10855 |
| | | | 257/330 |
| 2013/0034957 A1* | 2/2013 | Miyata | H01L 21/3212 |
| | | | 438/637 |
| 2014/0061782 A1* | 3/2014 | Kim | H01L 27/088 |
| | | | 257/331 |
| 2014/0264517 A1* | 9/2014 | Kim | H01L 21/823412 |
| | | | 257/296 |
| 2015/0008530 A1* | 1/2015 | Park | H01L 27/10894 |
| | | | 257/369 |
| 2015/0228573 A1* | 8/2015 | Park | H01L 23/535 |
| | | | 257/390 |
| 2015/0255466 A1* | 9/2015 | Hwang | H01L 21/02164 |
| | | | 438/586 |
| 2016/0071908 A1* | 3/2016 | Murooka | H01L 27/2463 |
| | | | 257/4 |
| 2016/0118331 A1* | 4/2016 | Kim | H01L 27/10894 |
| | | | 257/401 |
| 2016/0181143 A1* | 6/2016 | Kwon | H01L 27/1052 |
| | | | 438/586 |

\* cited by examiner

SEMICONDUCTOR DEVICE

CROSS-REFERENCE TO RELATED APPLICATION

This application claims the benefit of Korean Patent Application No. 10-2016-0174770, filed on Dec. 20, 2016, in the Korean Intellectual Property Office, the disclosure of which is incorporated herein in its entirety by reference.

BACKGROUND

Inventive concepts relate to a semiconductor device, and more particularly, to a semiconductor device including a direct contact and a bit line.

As electronic devices become smaller and lighter according to rapid developments in the electronic industry and user demand, a semiconductor device having a high degree of integration when used in electronic devices is desired, and design rules for a configuration of the semiconductor device are being reduced and/or tightened. As a result, aspect ratios of a line including a conductive pattern of the semiconductor device are increasing.

SUMMARY

Inventive concepts provide a semiconductor device including a bit line with reduced aspect ratio and a method of manufacturing the same.

Inventive concepts are not limited to the above objectives, but other objectives not described herein may be clearly understood by those of ordinary skill in the art from descriptions below.

According to an example embodiment of inventive concepts, there is provided a semiconductor device including a substrate including a cell active region and a peripheral active region, a direct contact arranged on a cell insulating pattern formed on the substrate and connected to the cell active region, a bit line structure including a thin conductive pattern, contacting a top surface of the direct contact and extending in one direction, and a peripheral gate structure in the peripheral active region. The peripheral gate structure include a stacked structure of a peripheral gate insulating pattern and a peripheral gate conductive pattern, the thin conductive pattern includes a first material and the peripheral gate conductive pattern include the first material, and a level of an upper surface of the thin conductive pattern is lower than a level of an upper surface of the peripheral gate conductive pattern.

According to another example embodiment of inventive concepts, there is provided a semiconductor device including a substrate including a cell active region and a peripheral active region, a cell insulating pattern in the cell active region, the cell insulating pattern including a direct contact hole, a thin conductive pattern, in which a first region filling the direct contact hole and a second region uniformly covering an upper surface of the cell insulating pattern and an upper surface of the first region are contiguous, a bit line including the second region and extending in one direction in the cell region; and a peripheral gate electrode in the peripheral active region and including a peripheral gate conductive pattern. A level of a top surface of the bit line is lower than a level of a top surface of the peripheral gate electrode.

According to another example embodiment of inventive concepts, there is provided semiconductor device including a substrate, a peripheral gate region including a peripheral gate structure on the substrate, the peripheral gate structure having an upper surface, and having a first height from a surface of the substrate to the upper surface, a cell array region including a bit line having a second height from the surface of the substrate to an upper surface of the bit line, the second height lower than the first height, and a buried contact in the substrate, the buried contact including a side connected to the bit line.

BRIEF DESCRIPTION OF THE DRAWINGS

Example embodiments of inventive concepts will be more clearly understood from the following detailed description taken in conjunction with the accompanying drawings in which.

DETAILED DESCRIPTION

Hereinafter, example embodiments of inventive concepts will be described in detail with reference to the accompanying drawings.

Figure 1:
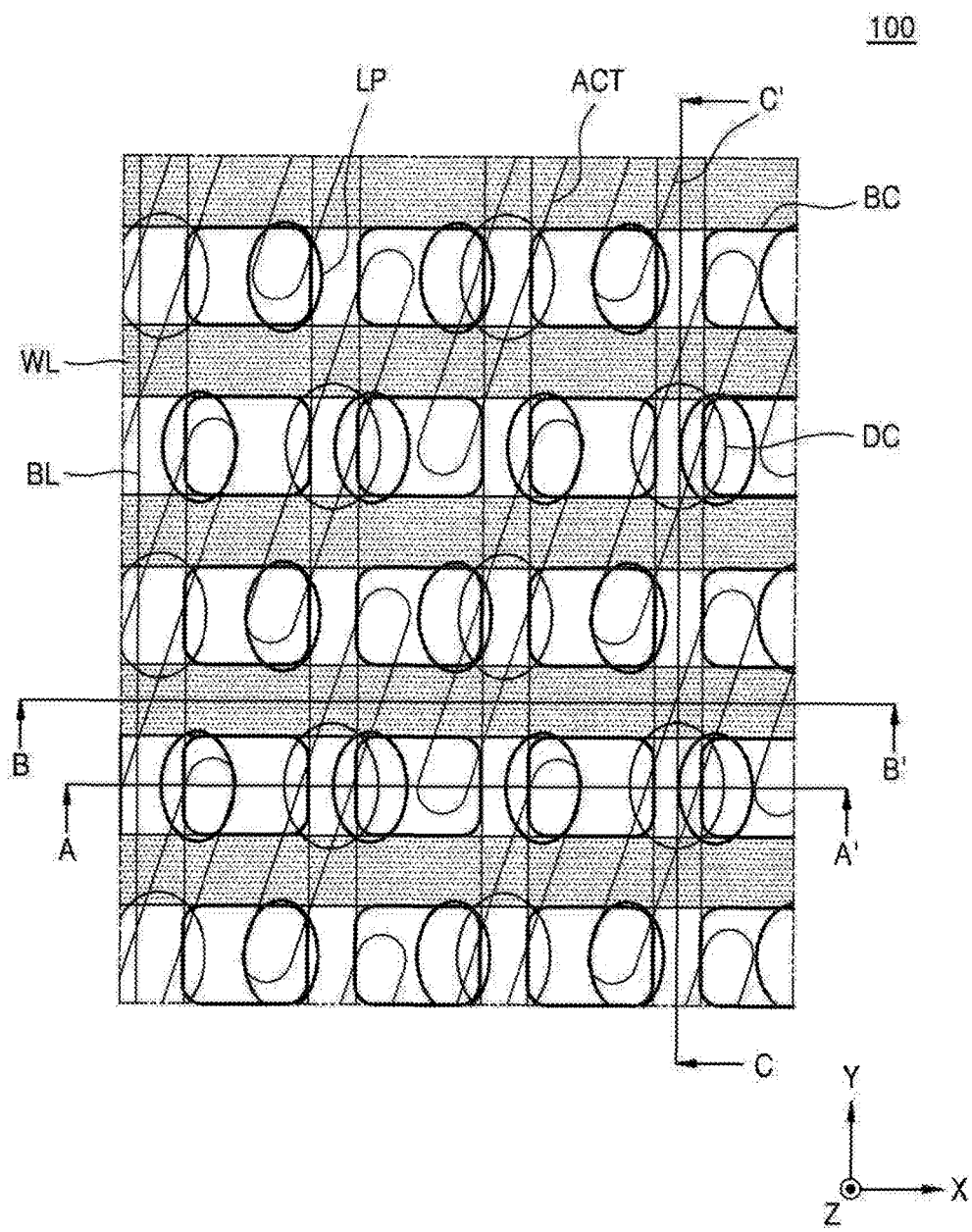
FIG. 1 is a plan view of major configurations of a cell array region in a semiconductor device, according to an example embodiment of inventive concepts.

FIG. 1 is a plan view of configurations of a cell array region in a semiconductor device 100, according to an example embodiment of inventive concepts.

Referring to FIG. 1, the semiconductor device 100 may include a plurality of active regions ACT. In some example embodiments, the plurality of active regions ACT may be arranged to have a long axis in an oblique direction with respect to a first direction (an X direction) and a second direction (a Y direction).

The plurality of active regions ACT formed in a cell array region (hereinafter, referred to as a cell region) including the semiconductor device 100 and an active region formed in a core and peripheral circuit region (hereinafter, referred to as a peripheral region) other than the cell region may be referred to as a peripheral active region (not shown). The semiconductor device 100 may be or may include a memory device. The memory device may be or may include a dynamic random access memory (DRAM) device; however, inventive concepts are not limited thereto.

A plurality of word lines WL may extend parallel to each other across the plurality of active regions ACT in the first direction (X direction). A plurality of bit lines BL may extend parallel to each other on the plurality of word lines WL along the second direction (Y direction) intersecting the first direction (X direction).

The plurality of bit lines BL may be connected to the plurality of active regions ACT through a direct contact DC.

In some example embodiments, a plurality of buried contacts BC may be formed between two neighboring bit lines BL among the plurality of bit lines BL. Each of the plurality of buried contacts BC may extend to an upper portion of any one of the two neighboring bit lines BL. In some example embodiments, the plurality of buried contacts BC may be arranged in a line along the first direction (X direction) and the second direction (Y direction).

A plurality of landing pads LP may be formed on the plurality of buried contacts BC. The plurality of buried contacts BC and the plurality of landing pads LP may connect a lower electrode (not shown) of a capacitor formed on the bit lines BL to the plurality of active regions ACT. The plurality of landing pads LP may be arranged so as to partially overlap the plurality of buried contacts BC, respectively.

FIGS. 2 through 14 are views of a method of manufacturing a semiconductor device in a process order, according to an example embodiment of inventive concepts.

For example, cell regions of FIGS. 2 through 14 are cross-sectional views taken along lines A-A', lines B-B', and lines C-C' of FIG. 1. Furthermore, peripheral regions of FIGS. 2 through 14 are sectional views taken along the X-direction or the Y-direction of FIG.

Figure 2:
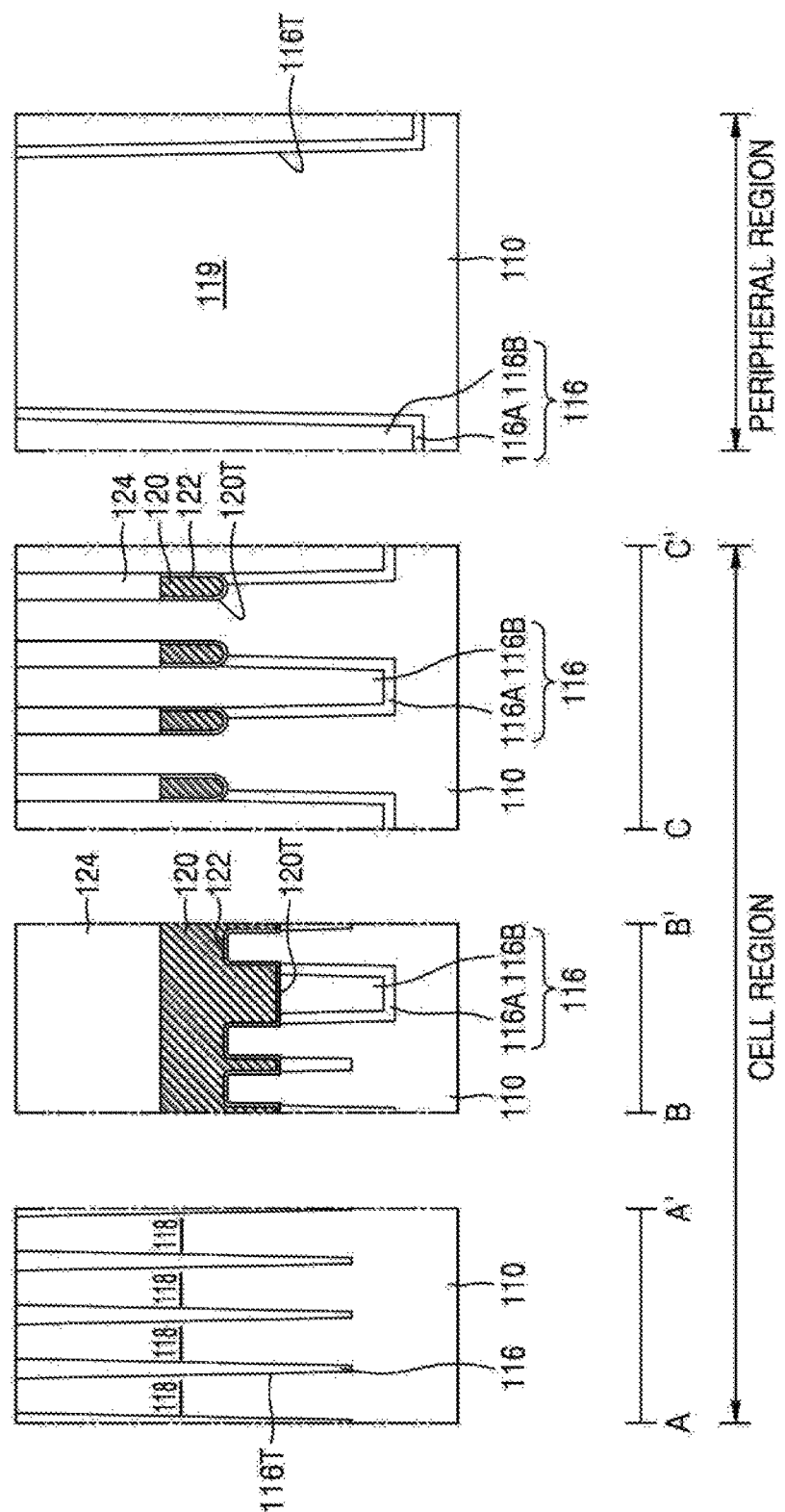
FIGS. 2 through 14 are views of a method of manufacturing a semiconductor device in a process order, according to an example embodiment of inventive concepts.

Referring to FIG. 2, an element isolation trench 116T may be formed in a substrate 110 including a cell region and a peripheral region, and an element isolation layer 116 may be formed in the element isolation trench 116T. A cell active region 118 may be defined in the cell region of the substrate 110 by the element isolation layer 116 and a peripheral active region 119 may be defined in the peripheral region. The cell active regions 118 may have a relatively long island shape having a short axis and a long axis similar to the active regions ACT illustrated in FIG. 1.

The substrate 110 may include silicon (Si), for example, crystalline Si, polycrystalline Si, or amorphous Si. Alternatively or additionally, the substrate 110 may include at least one of a semiconductor element such as germanium (Ge), silicon germanium (SiGe), silicon carbide (SiC), gallium arsenide (GaAs), indium arsenide (InAs), and indium phosphide (InP). Alternatively or additionally, the substrate 110 may include a silicon-on-insulator (SOI) structure, for example, a buried oxide (BOX) layer. Alternatively or additionally, the substrate 110 may include a conductive region, for example, a well or a structure doped with impurities. The substrate may be or may include a wafer, for example a wafer of 200 mm in diameter, a wafer of 300 mm in diameter, or a wafer of 350 mm in diameter. However, inventive concepts are not limited thereto. For example, after formation of the semiconductor device 100, the wafer may be diced into individual chips.

The element isolation layer 116 may be composed of or include a material including at least one of, for example, a silicon oxide layer, a silicon nitride layer, and a silicon oxynitride layer. The element isolation layer 116 may be composed of or include a single layer including one kind of insulating layer, a double layer including two kinds of insulating layers, or a multilayer including a combination of at least three kinds of insulating layers, and inventive concepts are not limited thereto. The element isolation layer 116 may be composed of or include a material deposited with a high density plasma (HDP) process, a spin-on glass (SOG) process, and/or other deposition processes; however, inventive concepts are not limited thereto.

In some example embodiments, the element isolation layer 116 may include a first element isolation layer 116A and a second element isolation layer 116B. The first element isolation layer 116A and the second element isolation layer 116B may include different materials. For example, the first isolation layer 116A may be or may include a silicon oxide layer, and the second isolation layer 116B may be or may include a silicon nitride layer. However, a structure of the element isolation layer 116 is not limited thereto.

A plurality of word line trenches 120T may be formed in the cell region of the substrate 110. The plurality of word line trenches 120T may extend in the first direction (X direction in FIG. 1) parallel to each other, and each of, or at least some of, the word line trenches 120T may have a line shape crossing the cell active region 118. As illustrated in the B-B' line section, the element isolation layer 116 and the substrate 110 may be etched by performing separate etching processes to form the plurality of word line trenches 120T each having a lower surface in a step form, and thus an etch depth of the element isolation layer 116 may be different from that of the substrate 110.

A gate dielectric layer 122, a plurality of word lines 120, and a plurality of buried insulating layers 124 may be sequentially formed in the plurality of word line trenches 120T after cleaning the plurality of word line trenches 120T. The plurality of word lines 120 may be the plurality of word lines WL illustrated in FIG. 1. The gate dielectric layer 122 may be formed by an in-situ steam generation (ISSG) process, a thermal oxidation process, and/or another process; however, inventive concepts are not limited thereto.

An upper surface of at least one of the plurality of word lines 120 may be located at a lower level than an upper surface of the substrate 110. A lower surface of at least one of the plurality of word lines 120 may have an uneven shape, and a saddle-finned transistor (saddle FinFET) may be formed in the plurality of cell active regions 118.

In the present specification, the term "level" refers to a height in a vertical direction from a main surface of the substrate 110. For example, being located at an identical level or at a certain level means that a height in a vertical direction from a main surface of the substrate 110 is identical or certain, and being located at a lower level or at a higher level means that a height in a vertical direction from a main surface of the substrate 110 is relatively low or relatively high. The vertical direction may correspond to the Z direction of FIG. 1.

In some example embodiments, after the plurality of word lines 120 are formed, impurity ions may be implanted into the substrate 110 on both sides of the plurality of word lines 120 to form source/drain regions on the upper surfaces of the plurality of cell active regions 118. In some example embodiments, an impurity ions implantation process may be performed to form the source/drain regions prior to forming the plurality of word lines 120. In some example embodiments, the plurality of word lines 120 may include titanium (Ti), titanium nitride (TiN), tantalum (Ta), tantalum nitride (TaN), tungsten (W), tungsten nitride (WN), titanium silicide nitride (TiSiN), tungsten silicide nitride (WSiN), and/or a combination thereof.

The gate dielectric layer 122 may include at least one of a silicon oxide layer, a silicon nitride layer, a silicon oxynitride layer, an oxide/nitride/oxide (ONO) layer, and a high-k dielectric layer having a dielectric constant higher than that of the silicon oxide layer. For example, the gate dielectric layer 122 may have a dielectric constant of about 10 to 25. In some example embodiments, the gate dielectric layer 122 may be or may include a metallic dielectric layer formed of at least one of hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (A10), and lead scandium tantalum oxide (PbScTaO).

An upper surface of at least one of the plurality of buried insulating layers 124 may be located at a lower level than an upper surface of the substrate 110. The plurality of buried insulating layers 124 may include a material layer selected from a silicon oxide layer, a silicon nitride layer, a silicon oxynitride layer, and/or a combination thereof, and inventive concepts are not limited thereto.

Figure 3:
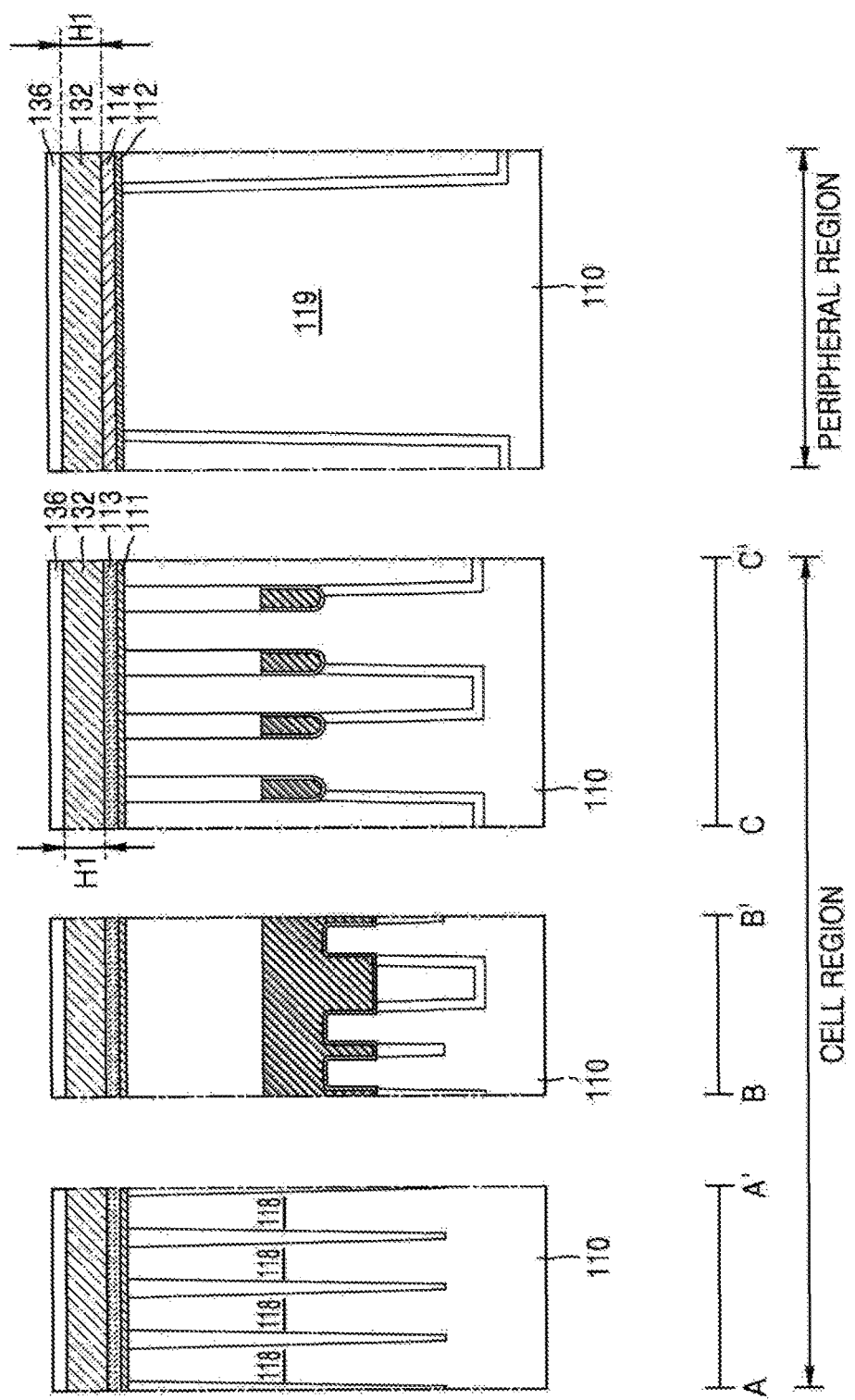

Referring to FIG. 3, a first insulating layer 111 may be formed in a cell region on the substrate 110, and a second insulating layer 112 may be formed in a peripheral region on the substrate 110. Thereafter, a third insulating layer 113 may be formed on the first insulating layer 111 in the cell region, and a fourth insulating layer 114 may be formed on the second insulating layer 112 in the peripheral region.

In some example embodiments, the first insulating layer 111 formed in the cell region and the second insulating layer 112 formed in the peripheral region may be formed together, and thus may include an identical material. In addition, the third insulating layer 113 formed in the cell region and the fourth insulating layer 114 formed in the peripheral region may be formed together, and thus may include an identical material. As a result, a cell insulating layer including the first and third insulating layers 111 and 113 may be formed in the cell region and a peripheral gate insulating layer including the second and fourth insulating layer 112 and 114 may be formed in the peripheral region. Accordingly, the cell insulating layer and the peripheral gate insulating layer may include an identical material.

In some example embodiments, the first insulating layer 111 may be formed by forming a preliminary first insulating layer to cover both the cell region and the peripheral region on the substrate 110 and then removing a portion of the preliminary first insulating layer corresponding to the peripheral region by performing a photolithography process. The second insulating layer 112 may be formed by forming a preliminary second insulating layer to cover both the cell region and the peripheral region on the substrate 110, and then removing a portion of the preliminary second insulating layer corresponding to the cell region by performing a photolithography process.

In some example embodiments, the first insulating layer 111 may be formed first, and then the second insulating layer 112 may be formed. Alternatively, the second insulating layer 112 may be formed first, and then the first insulating layer 111 may be formed.

The first and second insulating layers 111 and 112 may include a non-metallic dielectric layer. For example, the first and second insulating layers 111 and 112 may include a silicon oxide layer, a silicon nitride layer, a silicon oxynitride layer, and/and/or a combination thereof. In some example embodiments, the second insulating layer 112 may have a larger dielectric constant than the first insulating layer 111. In some example embodiments, a thickness of the first insulating layer 111 may be greater than that of the second insulating layer 112.

The third and fourth insulating layers 113 and 114 may include a metallic dielectric layer. The third and fourth insulating layers 113 and 114 may have a larger dielectric constant than the first and second insulating layers 111 and 112. For example, the third and fourth insulating layers 113 and 114 may include at least one of materials included in the metallic dielectric layer forming the gate dielectric layer 122 of FIG. 2.

In some example embodiments, a work-function adjusting layer (not shown) may be selectively formed on the fourth insulating layer 114. The work-function adjusting layer may include a stacked structure of a metal, a conductive metal nitride, conductive metal carbide, a conductor including a metal atom, and/or a combination thereof. The work-function adjusting layer may include at least one of materials selected from Ti, Ta, aluminum (Al), nickel (Ni), cobalt (Co), lanthanum (La), palladium (Pd), niobium (Nb), molybdenum (Mo), hafnium (Hf), iridium (Ir), ruthenium (Ru), platinum (Pt), ytterbium (Yb), dysprosium (Dy), erbium (Er), palladium (Pd), titanium aluminum (TiAl), hafnium silicon molybdenum (HfSiMo), TiN, WN, TaN, ruthenium nitride (RuN), molybdenum nitride (MoN), titanium aluminum nitride (TiAlN), tantalum carbide (TaC), and titanium carbide (TiC).

In some example embodiments, a level of an upper surface of the cell insulating layer may be the same as that of an upper surface of the peripheral gate insulating layer. In some example embodiments, a level of an upper surface of the cell insulating layer may be different from that of an upper surface of the peripheral gate insulating layer.

Subsequently, a first conductive layer 132 may be formed on the second and fourth insulating layers 112 and 114 to cover both the cell region and the peripheral region. The first conductive layer 132 may include, for example, a doped semiconductor material. In some example embodiments, the first conductive layer 132 may include doped polysilicon. A thickness H1 of the first conductive layer 132 may be the same in the cell region and the peripheral region.

Thereafter, a sacrificial layer 136 may be formed on the first conductive layer 132 to cover both the cell region and the peripheral region. The sacrificial layer 136 may include a material having a high etch selectivity with respect to the first conductive layer 132. For example, the sacrificial layer 136 may include a silicon oxide layer, a silicon nitride layer, a silicon oxynitride layer, and/or a combination thereof.

Figure 4:
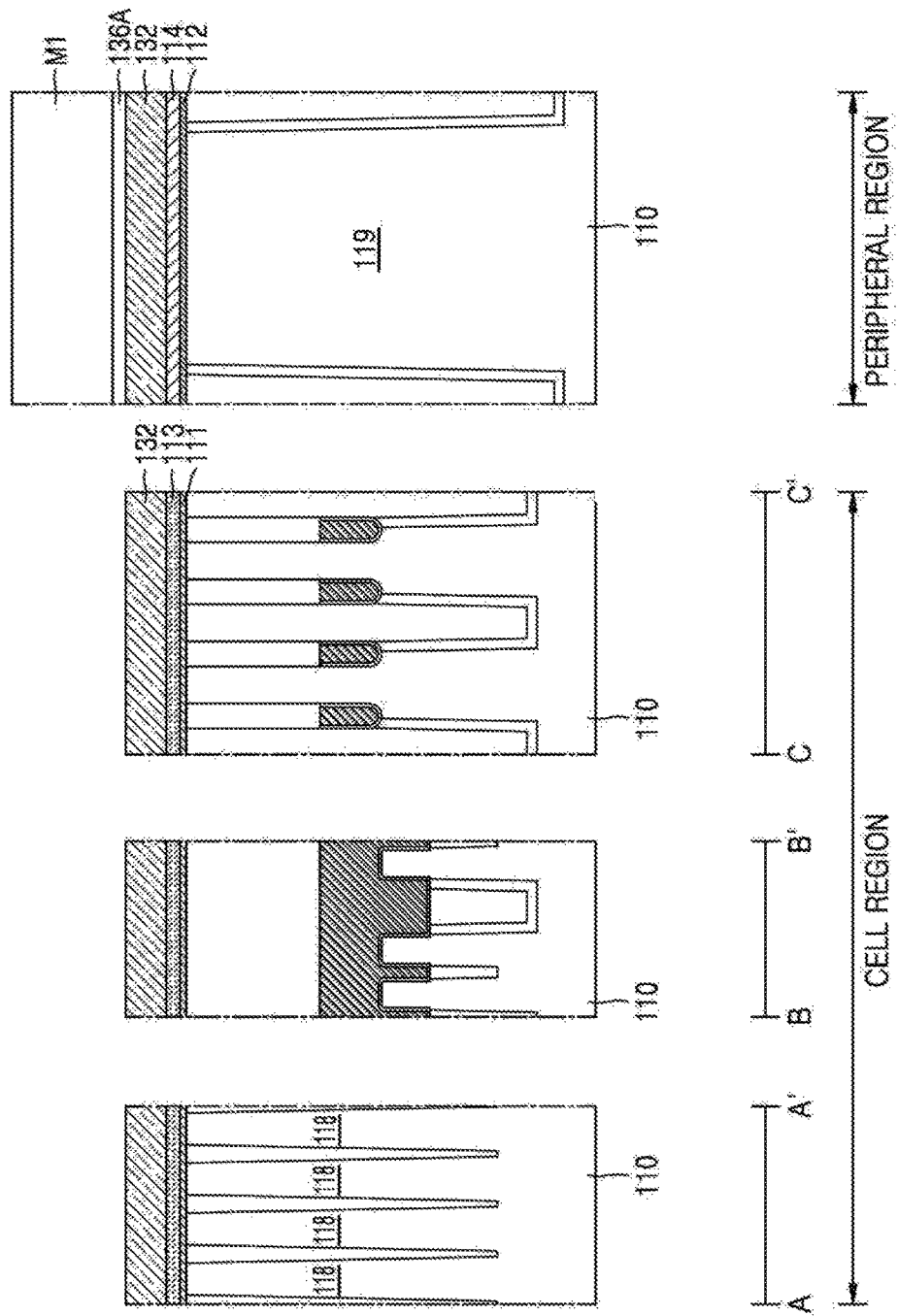

Referring to FIG. 4, a sacrificial pattern 136A may be formed in the peripheral region by removing a portion of the sacrificial layer 136 (see FIG. 3) that was formed in the cell region by performing a photolithography process.

For example, a photoresist may be coated on the sacrificial layer 136, and the photoresist is patterned by exposure and development to form a first photoresist pattern M1. The first photoresist pattern M1 may expose the upper surface of the sacrificial layer 136 in the cell region.

Subsequently, the sacrificial pattern 136A may be formed on the peripheral region by etching the portion of the sacrificial film 136 in the cell region using the first photoresist pattern M1 as an etching mask. Thereafter, the first photoresist pattern M1 may be removed using ashing and stripping processes. The ashing process may include plasma ashing with oxygen. The stripping process may include wet stripping with a solution included sulfuric acid and/or hydrogen peroxide. The removal process of the first photoresist pattern M1 may be performed under a condition wherein etching of the first conductive layer 132 and the sacrificial pattern 136A is suppressed or reduced.

Figure 5:
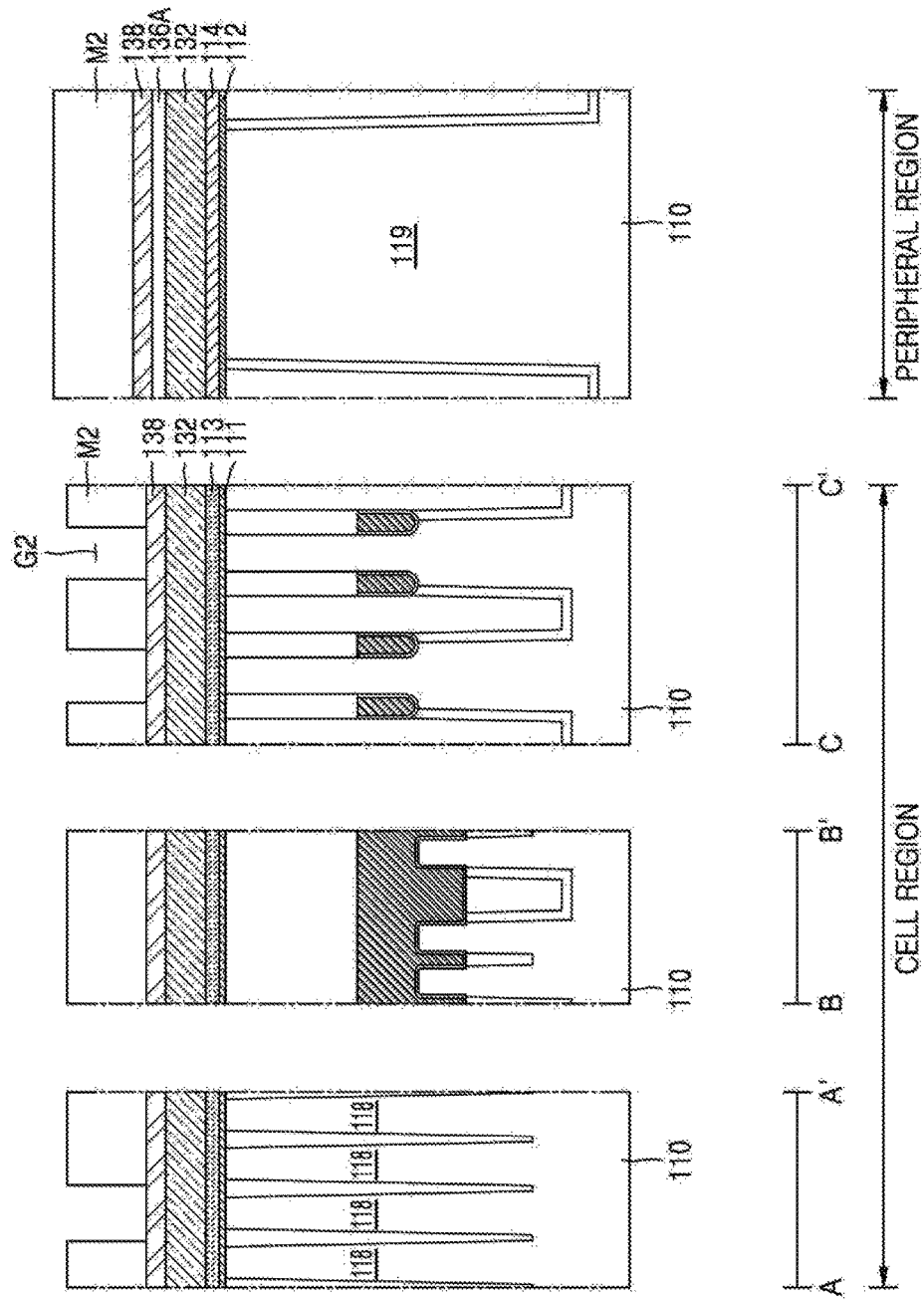

Referring to FIG. 5, a hard mask layer 138, which is in contact with the first conductive layer 132 in the cell region and the sacrificial pattern 136A in the peripheral region, may be formed to cover both the cell region and the peripheral region. Thereafter, a second photoresist pattern M2 may be formed on the hard mask layer 138.

The hard mask layer 138 may be or may include a material having a sufficient etch selectivity with respect to the first conductive layer 132, but is not limited thereto. For example, the hard mask layer 138 may be or may include a carbon material. For example, the hard mask layer 138 may be or may include an amorphous carbon layer (ACL), a hydrocarbon compound having a relatively high carbon content of from about 85% to about 99% by weight based on the total weight, or a spin-on hard mask (SOH).

A photoresist may be coated on the hard mask layer 138, and the photoresist is patterned by exposure and development to form the second photoresist pattern M2. The second photoresist pattern M2 may have an opening G2 for partially exposing the hard mask layer 138 in the cell region.

Figure 6:
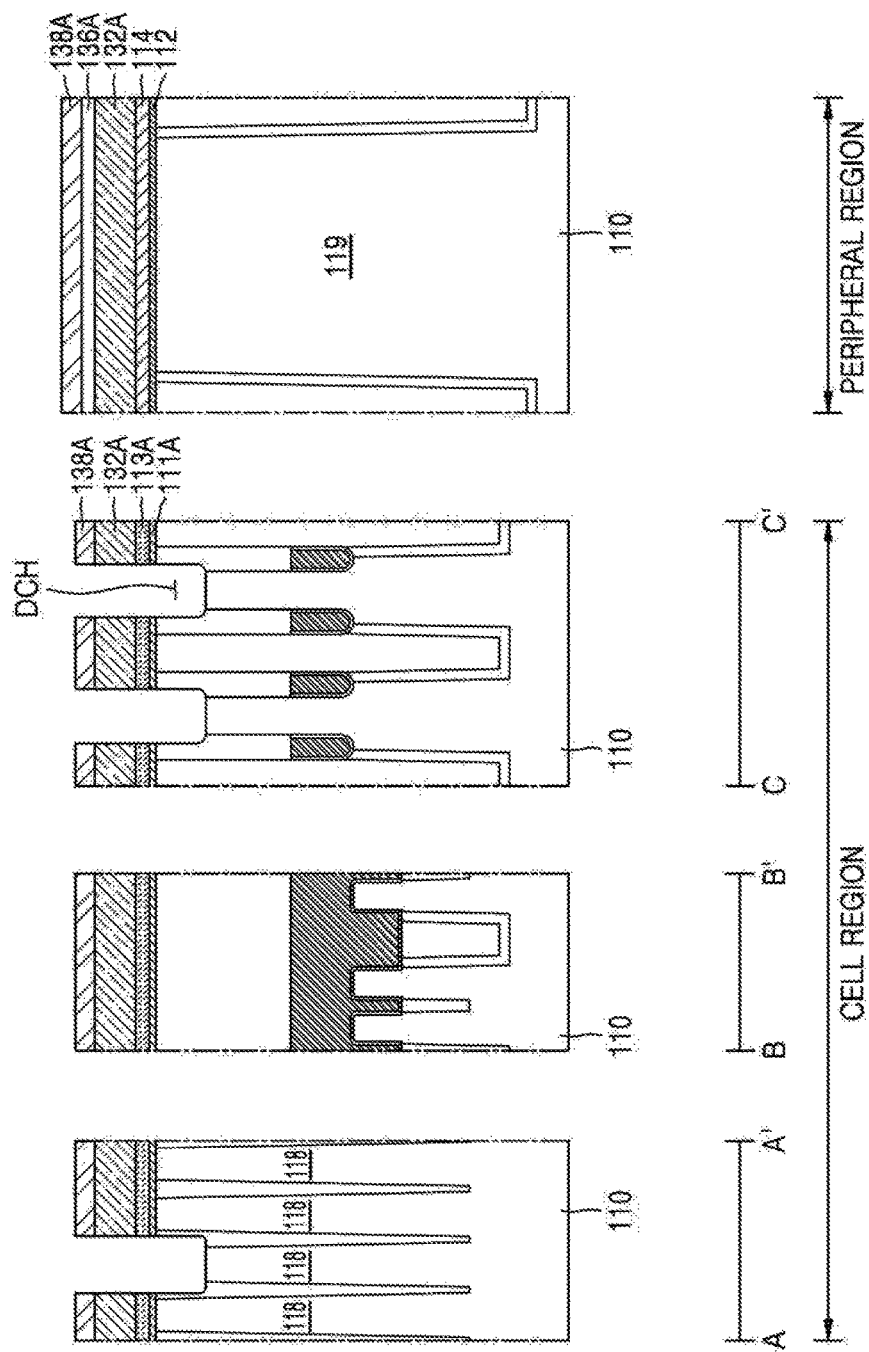

Referring to FIG. 6, a portion of the hard mask layer 138 (see FIG. 5) exposed through the opening G2 (see FIG. 5) of the second photoresist pattern M2 (see FIG. 5) is etched to form a hard mask pattern 138A. Thereafter, the first conductive layer 132 (see FIG. 5), the third insulating layer 113 (see FIG. 5), the first insulating layer 111 (see FIG. 5), and a partial upper surface of the substrate 110 (see FIG. 5) may be etched using the hard mask pattern 138A as an etching mask.

As a result, a direct contact hole DCH is formed which exposes the cell active region 118 of the substrate 110 in a cell region. Furthermore, a first conductive pattern 132A, a third insulating pattern 113A, and a first insulating pattern 111A may be formed to define the direct contact hole DCH. In some example embodiments, a level of a lower surface of the direct contact hole DCH may be lower than that of an upper surface of the substrate 110. In some example embodiments, the partial upper surface of the substrate 110 may not be etched.

Figure 7:
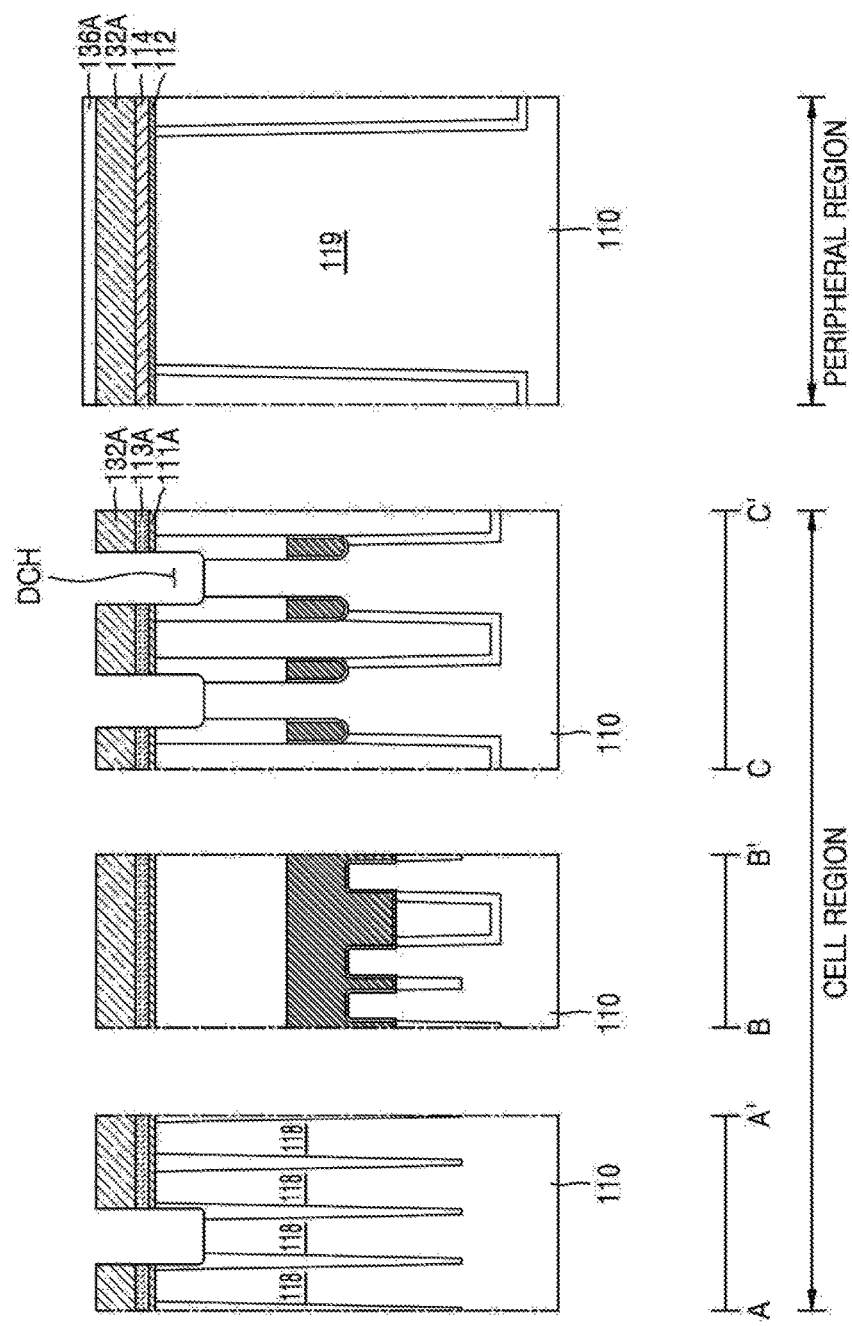

Referring to FIG. 7, the hard mask pattern 138A (see FIG. 6) may be removed from both the cell region and the peripheral region, The hard mask pattern 138A may be removed using ashing and stripping processes. The ashing process may include plasma ashing with oxygen. The stripping process may include wet stripping with a solution included sulfuric acid and/or hydrogen peroxide. In addition, the removal process of the hard mask pattern 138A may be performed under a condition wherein etching of the first conductive pattern 132A and the sacrificial pattern 136A is suppressed or reduced.

In some example embodiments, after the hard mask pattern 138A may be removed, a silicon treatment process may be performed. The silicon treatment process is a process for weakly etching or cleaning a surface of the substrate 110 or the like, which may have been damaged during the etching process described above with reference to FIG. 6, to produce a good surface state. For example, a surface of the substrate 110 under the direct contact hole DCH may be damaged and/or may include a native oxide layer formed during the etching, ashing, and/or stripping processes. The damage and/or the native oxide layer may impair the yield and/or reliability of the semiconductor device. Accordingly, a cleaning process for removing native oxide and other contaminants may be performed. For example, the cleaning process may include a wet cleaning process using a SC-1 solution or a wet cleaning process using a diluted hydrofluoric acid solution.

Figure 8:
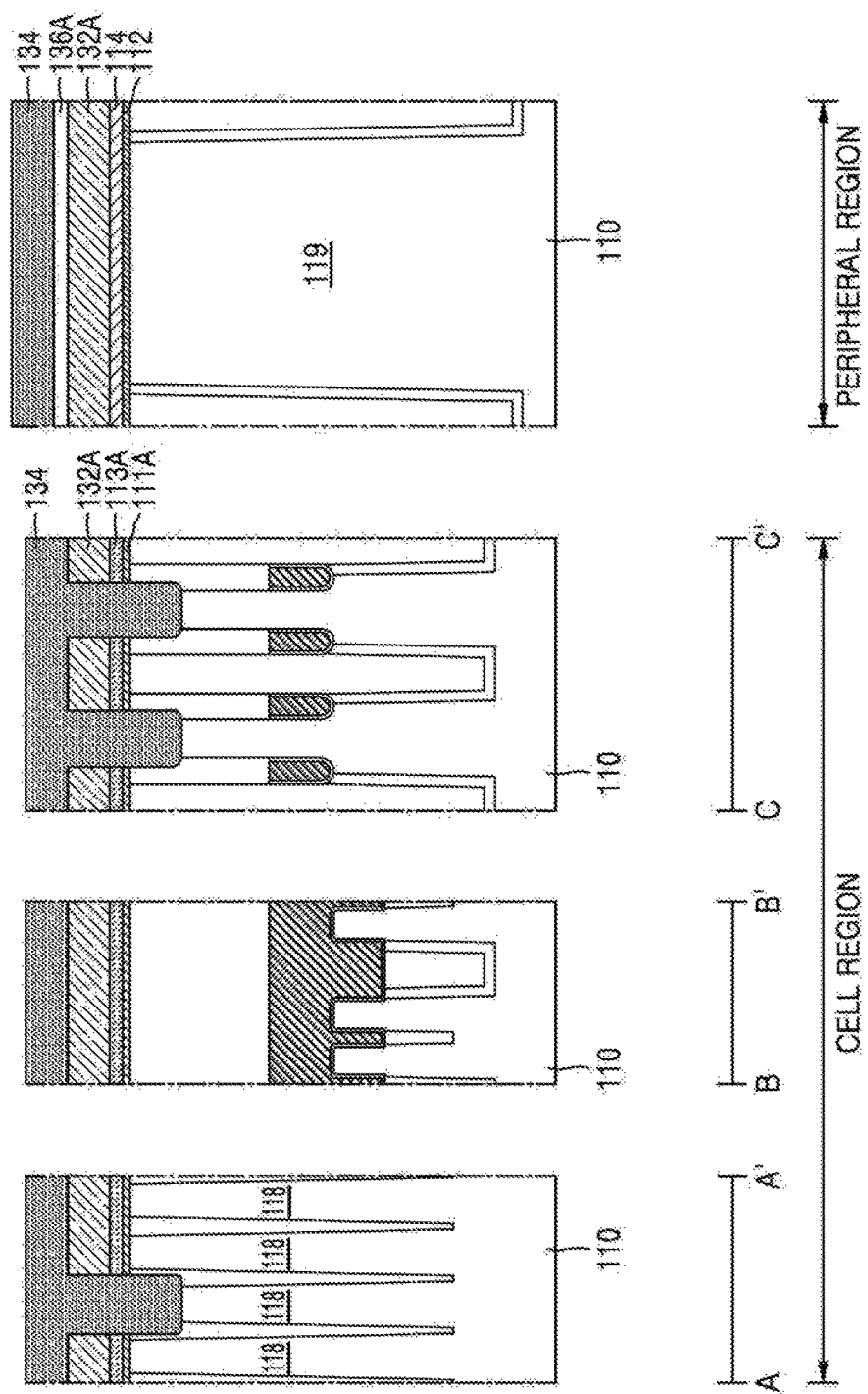

Referring to FIG. 8, after all direct contact holes DCH (see FIG. 7) are filled to form direct contacts DC, second conductive layers 134 are respectively formed to cover upper surfaces of the first conductive pattern 132A and the sacrificial pattern 136A. The second conductive layers 134 may be formed consecutively with, or in-situ with, the forming of the direct contacts DC. The second conductive layers 134 may be formed and the direct contacts DC may be formed with a chemical vapor deposition (CVD) process, for example, plasma enhanced chemical vapor deposition (PECVD) process; however, inventive concepts are not limited thereto.

The second conductive layer 134 may include, for example, a doped semiconductor material. In some example embodiments, the second conductive layer 134 may include doped polysilicon. The second conductive layer 134 may be formed with dopants deposited in-situ with the deposition of the second conductive layer 134. Additionally or alternatively, dopants may be implanted into the second conductive layer 134. However, inventive concepts are not limited thereto. Thermal processes, including rapid thermal processing (RPT) processes, may be performed to convert the second conductive layer 134 from an amorphous state to a polycrystalline state and/or to activate the dopants included in the second conductive layer 134.

Both the second conductive layer 134 and the first conductive layer 132 (see FIG. 3) may include a doped semiconductor material, for example, doped polysilicon. In addition, a doping concentration of the second conductive layer 134 may be higher than that of the first conductive layer 132. In some example embodiments, the second conductive layer 134 may include at least one dopant of phosphorus (P) and arsenic (As) at a doping concentration of from about 1E19 to about 1E22 atoms/cm$^3$, and the first conductive layer 132 may include at least one dopant of P, As, and boron (B) at a doping concentration of from about 1E14 to about 1E17 atoms/cm$^3$. However, configurations of the first and second conductive layers 132 and 134 are not limited thereto.

The first and second conductive layers 132 and 134 having the same material but different doping concentrations may be formed in a cell region to have an interface so that the first and second conductive layers 132 and 134 may have a lower interface resistance than when they may be formed of a heterogeneous material.

Figure 9:
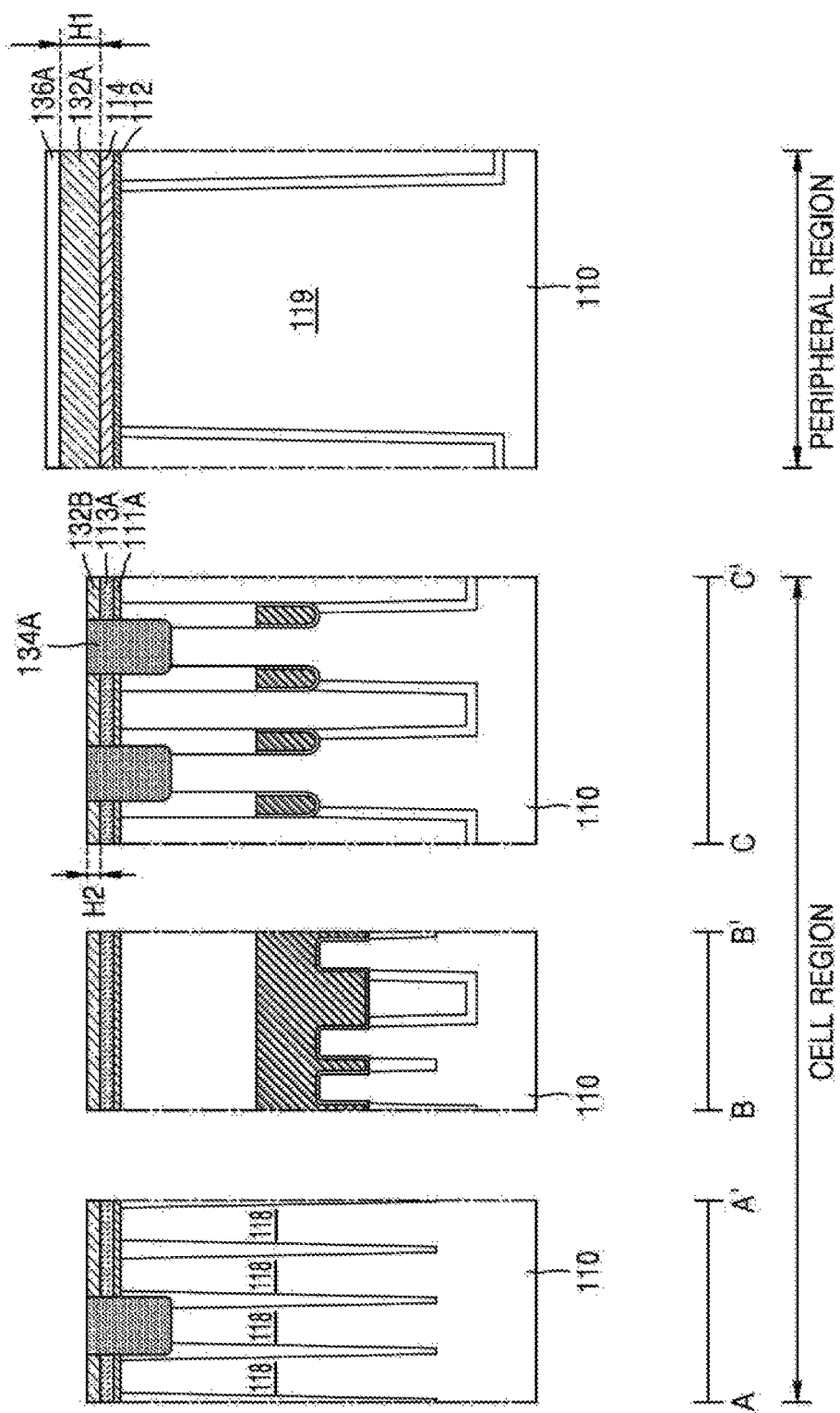

Referring to FIG. 9, a direct contact 134A and a first conductive pattern 132B, which is thinner than an initial state (hereinafter, referred to as a first thin conductive pattern 132B), may be formed by entirely etching surfaces of the second conductive layer 134 (see FIG. 8) and the first conductive pattern 132A (see FIG. 8).

The entire-surface process leaves the direct contact 134A and the first thin conductive pattern 132B in a cell region and completely removes the second conductive layer 134 from a peripheral region using an etch-back method, for example a blanket etch method, and/or a chemical-mechanical polishing (CMP) method. The sacrificial pattern 136A protects the first conductive pattern 132A in the peripheral region during the entire-surface etching process.

A part of an upper portion of the first conductive pattern 132A may be removed from the cell region through the entire-surface etching process so that the first thin conductive pattern 132B having a thickness less than the first conductive pattern 132A may be formed. For example, a thickness H2 of the first thin conductive pattern 132B may be less than the thickness H1 of the first conductive pattern 132A.

Upper surfaces of the direct contact 134A and the first thin conductive pattern 132B may be exposed in the cell region and a level of the upper surface of the direct contact 134A may be the same as that of the upper surface of the first thin conductive pattern 132B. Each side of the direct contact 134A and the first thin conductive pattern 132B may be in contact with each other with an interface therebetween. However, configurations of the direct contact 134A and the first thin conductive pattern 132B are not limited thereto.

Figure 10:
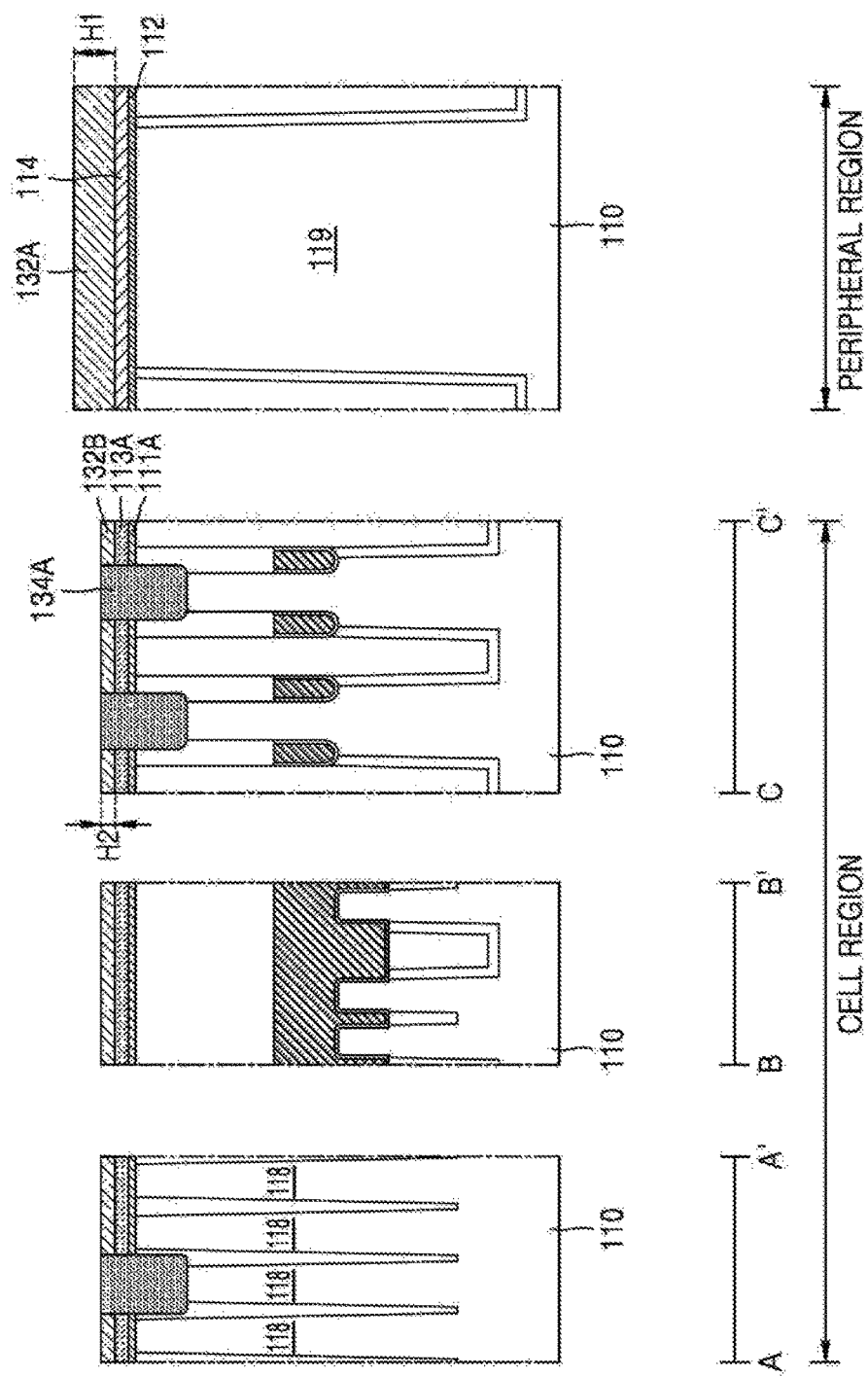

Referring to FIG. 10, the sacrificial pattern 136A (see FIG. 9) on the first conductive pattern 132A may be removed from a peripheral region.

In a process of forming the direct contact 134A and the first thin conductive pattern 132B in a cell region, the peripheral region may be covered by a mask such as the sacrificial pattern 136A, and the sacrificial pattern 136A may be removed from the peripheral region after both the direct contact 134A and the first thin conductive pattern 132B are formed in the cell region.

In some example embodiments, the sacrificial pattern 136A may be removed by wet etching. The removal process of the sacrificial pattern 136A may be performed under a condition wherein etching of the direct contact 134A and the first thin conductive pattern 132B in the cell region is suppressed or reduced. A solution for wet etching may include hydrogen fluoride and/or another chemical that etches the sacrificial pattern 136A faster than the direct contact 134A and the first thin conductive pattern 132B.

As a result, the thickness H1 of the first conductive pattern 132A in the peripheral region may be greater than the thickness H2 of the first thin conductive pattern 132B in the cell region. For example, a level of an upper surface of the first conductive pattern 132A in the peripheral region may be higher than that of an upper surface of the first thin conductive pattern 132B and that of an upper surface of the direct contact 134A or an upper surface of the direct contact 134A and he second insulating layer 132B in the cell region.

Accordingly, the first thin conductive pattern 132B in the cell region may form a part of a plurality of bit line structures 148 (see FIG. 13) in a subsequent process, and the first conductive pattern 132A in the peripheral region may include at least a part of the peripheral gate conductive pattern and may form a part of a peripheral gate structure 148P (see FIG. 13), and thus may achieve vertical step down of the at least one of the plurality of bit line structures 148 in the cell region while maintaining a height of the peripheral gate structure 148P in the peripheral region. The peripheral gate structure 148P may include a gate for an NMOS or a PMOS transistor. The gate may be used as a row driver and/or a sense amplifier for the semiconductor device. The sense amplifier may sense a charge on the plurality of bit line structures 148. The row driver may control the voltage of a word line, for example, one of the pluralities of word lines WL. The gate may be used as a gate for an inverter, a buffer, an analog circuit, and/or a digital circuit for the semiconductor device.

Figure 11:
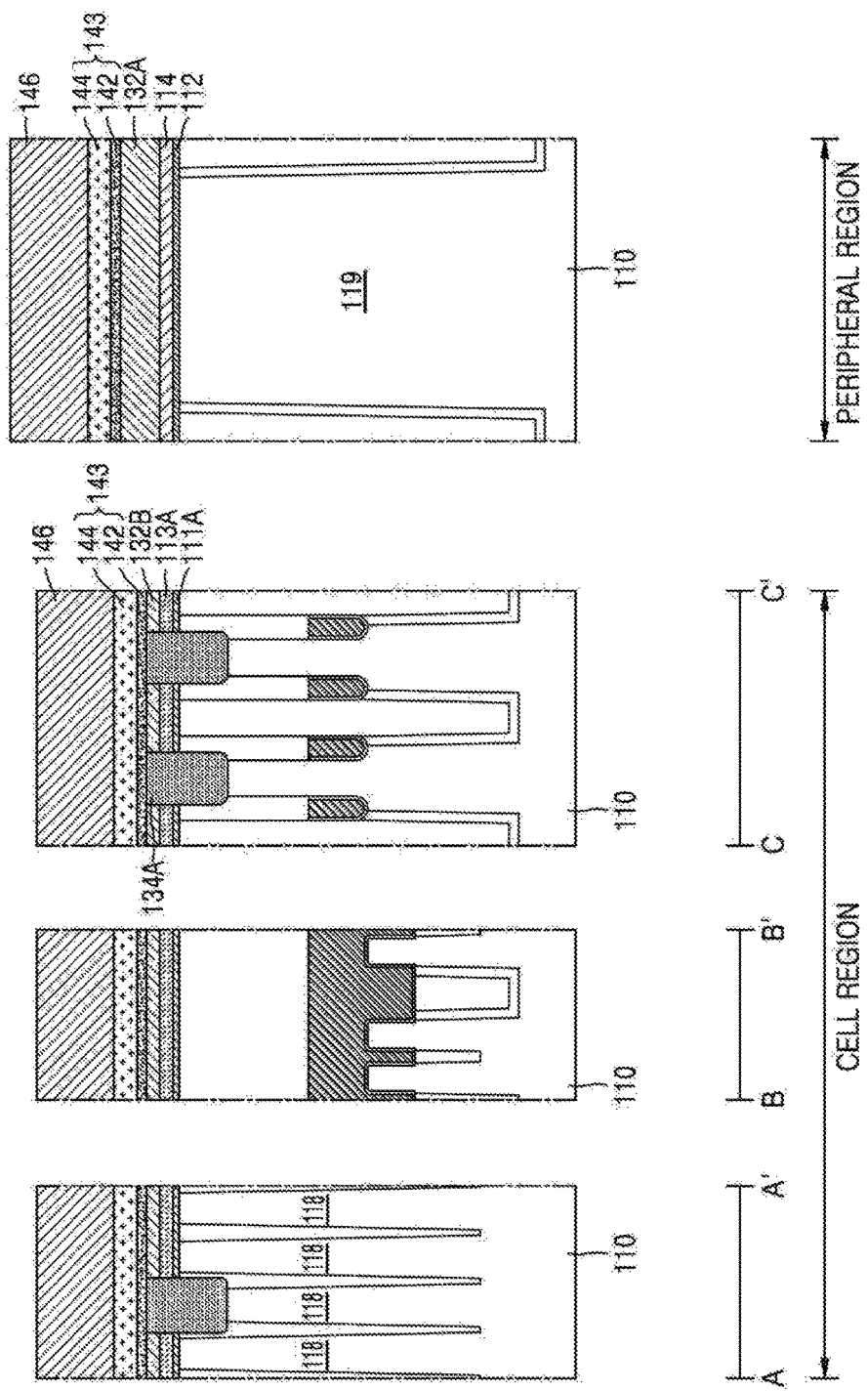

Referring to FIG. 11, a metal layer 143 covering the direct contact 134A and the first thin conductive pattern 132B in a cell region and covering the first conductive pattern 132A in a peripheral region may be formed. Thereafter, an insulating capping layer 146 may be formed on the metal layer 143. The metal layer 143 may be or may include a metallic conductive layer.

In some example embodiments, the metal layer 143 may be or may include a stacked structure of a lower metal layer 142 and an upper metal layer 144. FIG. 11 shows that the metal layer 143 has the stacked structure of a double conductive layer including the lower metal layer 142 and the upper metal layer 144, however, inventive concepts is not limited thereto. For example, the metal layer 143 may be formed as a monolayer or a stacked structure of three or more layers. The metal layer 143 may be formed with a physical vapor deposition (PVD) process and/or a CVD process; however, inventive concepts are not limited thereto.

In some example embodiments, the lower metal layer 142 may include TiN or TSN (Ti—Si—N). In addition, the upper metal layer 144 may include W or tungsten silicide (WSix). In some example embodiments, the lower metal layer 142 may function as a diffusion barrier.

The insulating capping layer 146 may be formed on the metal layer 143. The insulating capping layer 146 may include, for example, a silicon nitride layer. In some example embodiments, a thickness of the insulating capping layer 146 may be greater than that of the metal layer 143. The insulating capping layer 146 may be formed with a PECVD process and/or a low pressure CVD (LPCVD) process; however, inventive concepts are not limited thereto.

Figure 12:
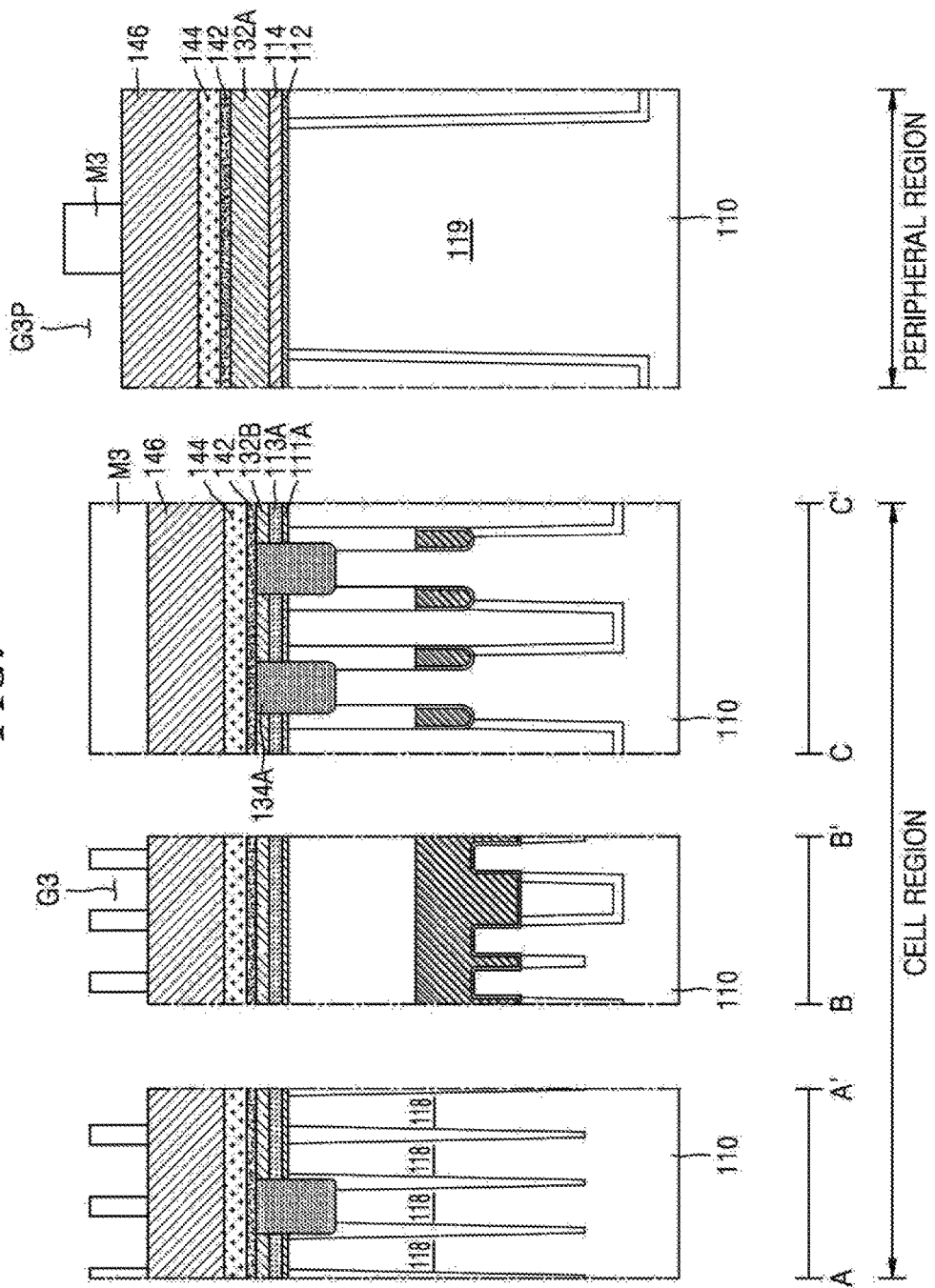

Referring to FIG. 12, a third photoresist pattern M3 may be formed on the insulating capping layer 146.

A photoresist may be coated on the insulating capping layer 146, and the photoresist is patterned by exposure and development to form the third photoresist pattern M3. The third photoresist pattern M3 may have an opening G3 for partially exposing the insulating capping layer 146 in a cell region and an opening G3P for partially exposing the insulating capping layer 146 in a peripheral region.

Figure 13:
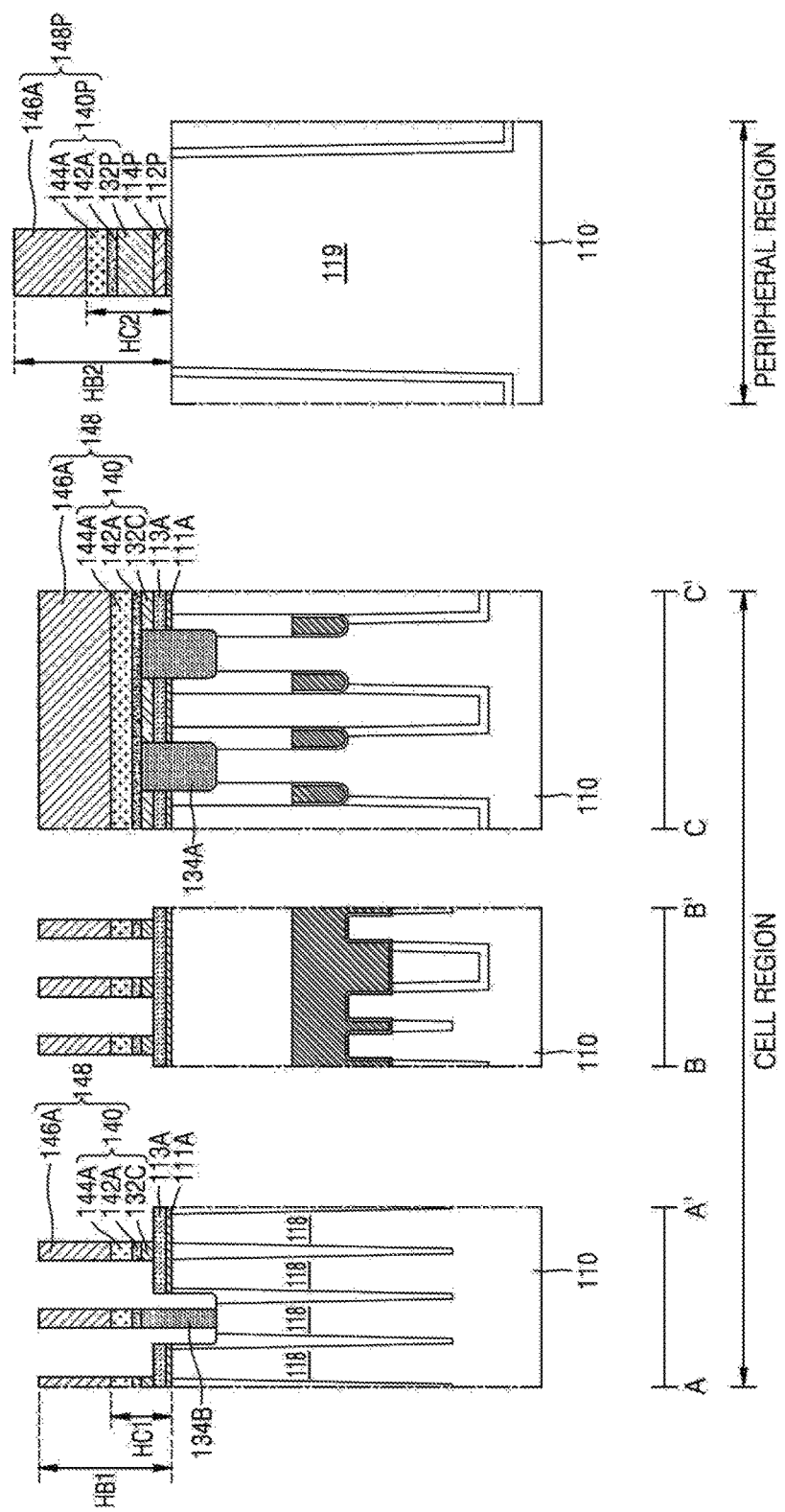

Referring to FIG. 13, one of the plurality of bit line structures 148 in a cell region and the peripheral gate structure 148P in a peripheral region may be formed on the substrate 110.

For example, a plurality of bit lines 140 including a first conductive line 132C, which is thinner than an initial state (hereinafter, referred to as a first thin conductive line 132C), a lower metal line 142A, and an upper metal line 144A in a line shape may be formed in the cell region by etching the first thin conductive pattern 132B (see FIG. 12), the lower metal layer 142 (see FIG. 12), the upper metal layer 144 (see FIG. 12), and the insulating capping layer 146 (see FIG. 12) using the third photoresist pattern M3 (see FIG. 12) as an etching mask. The upper metal line 144A and the lower metal line 142A may be or may include a metallic conductive pattern. The metallic conductive pattern may include tungsten; however, inventive concepts are not limited thereto. Thereafter, a plurality of insulating capping lines 146A may be formed on the plurality of bit lines 140.

Furthermore, a plurality of peripheral gate electrodes 140P including a first conductive line 132P, the lower metal line 142A, and the upper metal line 144A may be formed in the peripheral region by etching the first conductive pattern 132A (see FIG. 12), the lower metal layer 142, the upper metal layer 144, and the insulating capping layer 146 by using the third photoresist pattern M3 as an etching mask, and the plurality of insulating capping lines 146A may be formed on the plurality of peripheral gate electrodes 140P.

One of the bit lines 140 and one of the insulating capping lines 146A may form one of the plurality of bit line structures 148.

The plurality of bit lines 140 and the plurality of insulating capping lines 146A may extend in the second direction (Y direction in FIG. 1) in parallel with each other, respectively. The plurality of bit lines 140 may include the plurality of bit lines BL illustrated in FIG. 1.

In an etching process for forming the plurality of bit lines 140, a direct contact conductive pattern 134B may be formed by etching a part of the direct contact 134A not overlapping the bit lines 140 in a direction perpendicular to a main surface of the substrate 110. In some example embodiments, a level of an upper surface of the direct contact conductive pattern 134B may be higher than that of an upper surface of the third insulating pattern 113A.

The plurality of bit lines 140 may include the first thin conductive line 132C formed of doped polysilicon, but may also have a relatively thin vertical stacked structure. A height HC1 of the plurality of bit lines 140 from the substrate 110 to the top surface may be relatively lower than a height HC2 of at least one of the peripheral gate electrodes 140P from the substrate 110 to the top surface.

For example, a height HB1 of the plurality of bit line structures 148 including the plurality of bit lines 140 from the substrate 110 to the top surface may be greater than a height HB2 of the peripheral gate structure 148P from the substrate 110 to the top surface.

A peripheral gate insulating pattern may include a second insulating pattern 112P and a fourth insulating pattern 114P. In addition, at least one of the peripheral gate electrodes 140P may include the first conductive line 132P, the lower metal line 142A, and the upper metal line 144A. In some example embodiments, as described above with reference to FIG. 3, when a work-function adjusting pattern is included on the fourth insulating pattern 114P, the work-function adjusting pattern may be further included between the peripheral gate insulating pattern and at least one of the peripheral gate electrodes 140P.

One of peripheral gate insulating patterns, one of the peripheral gate electrodes 140P, and one of the insulating capping lines 146A may form the peripheral gate structure 148P.

The peripheral gate insulating layers, the peripheral gate electrodes 140P, and the insulating capping lines 146A may extend in the first direction (X direction in FIG. 1) or the second direction (Y direction in FIG. 1) in parallel with each other, respectively.

Accordingly, a level of an upper surface of the first thin conductive line 132C including the plurality of bit line structures 148 formed in the cell region may be lower than a level of an upper surface of the first conductive line 132P of the peripheral gate structure 148P formed in the peripheral region, and thus the height HC1 of at least one of the bit lines 140 from the substrate 110 to the top surface may be reduced. This effectively reduces parasitic capacitance that may occur or exist between a buried contact 170 (see FIG. 14) and at least one of the bit lines 140 due to leaning (or collapsing) defects of the bit lines 141, stray electric fields, and/or a subsequent process of the plurality of bit line structures 148. The height HC2 of the peripheral gate structure may be desired to be relatively high, to control the work-function and/or depletion ratios of the peripheral gate structure. The height HC1 of one of the plurality of bit lines 141 may be desired to be relatively lower to reduce parasitic capacitance and/or stray electric fields between one of the plurality of bit lines 141 and one of the plurality of buried contacts 170.

According to inventive concepts, reliability of a semiconductor device and productivity of a manufacturing process of the semiconductor device may be improved.

Figure 14:
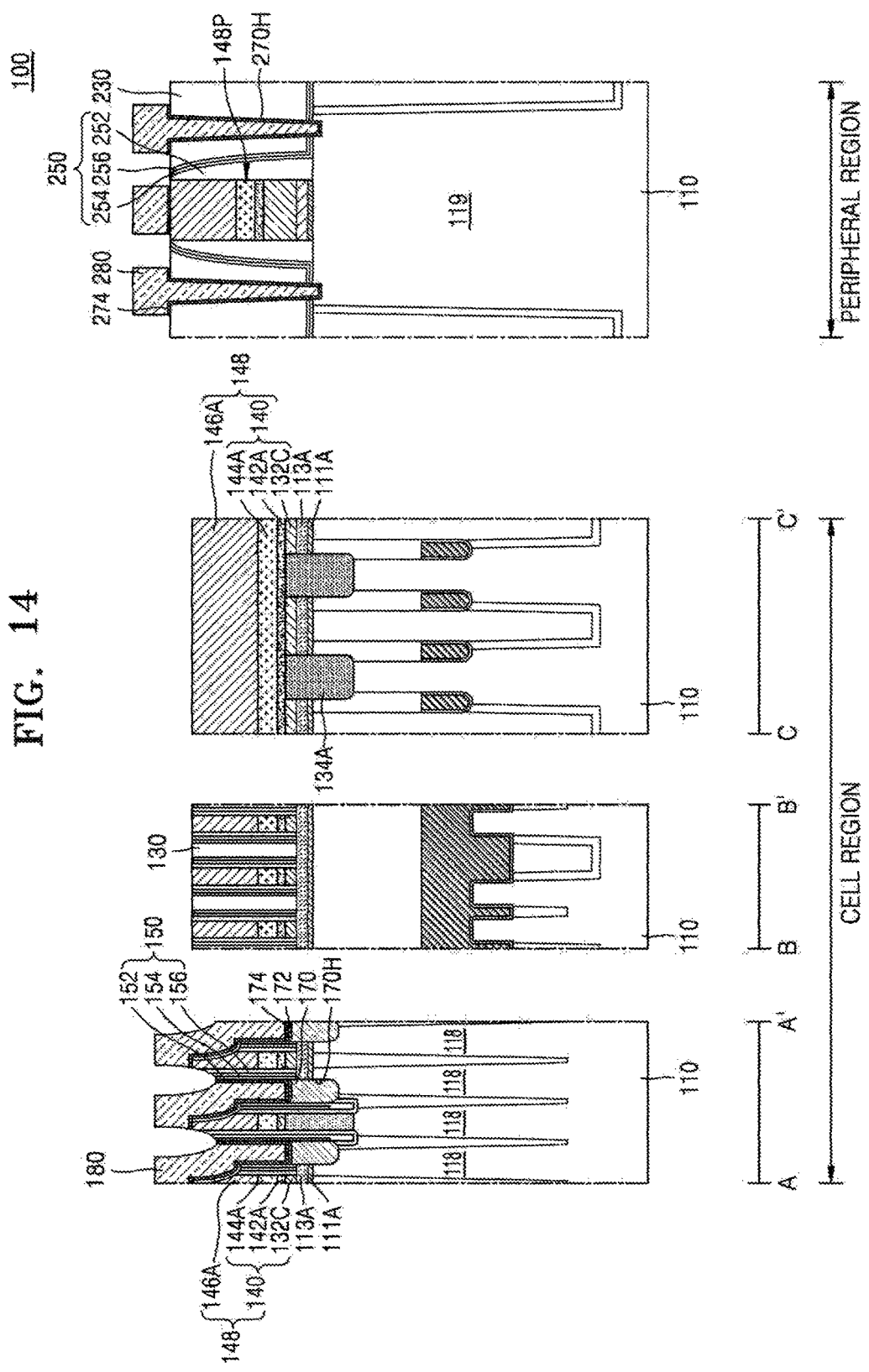

Referring to FIG. 14, the semiconductor device 100 including the plurality of bit line structures 148 in a cell region and a plurality of peripheral gate structures 148P in a peripheral region may be formed.

For example, both sidewalls of each of, or at least some of, the plurality of bit line structures 148 in the cell region may be covered with an insulating spacer structure 150. A plurality of insulating spacer structures 150 may include a first insulating spacer 152, a second insulating spacer 154, and a third insulating spacer 156, respectively. In some example embodiments, each of, or at least one of, the first insulating spacer 152, the second insulating spacer 154, and the third insulating spacer 156 may include a silicon oxide layer, a silicon nitride layer, a silicon oxynitride layer, and/or a combination thereof. In some example embodiments, each of, or at least one of, the first and third insulating spacers 152 and 156 may include a silicon oxide layer, a silicon nitride layer, a silicon oxynitride layer, and/or a combination thereof, and the second insulating spacer 154 interposed between the first and third insulating spacers 152 and 156 may be or may include an air spacer.

A plurality of buried contact holes 170H may be formed between the plurality of bit lines 140. An inner space of each of, or at least some of, the buried contact holes 170H may be defined by the insulating spacer structure 150 and the cell active region 118 that cover sidewalls of two neighboring bit lines 140 from among the plurality of bit lines 140.

The plurality of buried contacts 170 and a plurality of landing pads 180 respectively connected to the plurality of cell active regions 118 may be formed in the plurality of buried contact holes 170H between the plurality of bit lines 140. The plurality of buried contacts 170 and the plurality of landing pads 180 may correspond to the plurality of buried contacts BC and the plurality of landing pads LP illustrated in FIG. 1, respectively.

The plurality of buried contacts 170 may extend from the cell active region 118 in the third direction (Z direction in FIG. 1) perpendicular to the substrate 110. The plurality of landing pads 180 may be respectively arranged on the plurality of buried contacts 170 and may extend over the plurality of bit lines 140. The plurality of landing pads 180 may be connected to the cell active region 118 through the plurality of buried contacts 170.

The landing pad 180 may be electrically connected to at least one of the plurality of buried contacts 170 and may extend from the inside of the buried contact hole 170H to the top of the plurality of bit line structures 148 to vertically overlap the plurality of bit line structures 148.

The landing pad 180 may extend along the third direction (Z direction in FIG. 1) perpendicular to the main surface of the substrate 110 in a region between the plurality of bit lines 140 and may cover at least a part of an upper surface of the plurality of bit lines 140 so as to vertically overlap at least a part of the plurality of bit lines 140.

A metal silicide layer 172 may be formed between at least one of the plurality of buried contact 170 and the landing pad 180. The metal silicide layer 172 may include, but is not limited to, cobalt silicide (CoSi), nickel silicide (NiSi), or manganese silicide (MnSi).

Conductive barrier layers 174 may be formed between the landing pad 180 and the insulating spacer structure 150 and between the landing pad 180 and the plurality of bit line structures 148, respectively. Each of, or at least one of, the conductive barrier layers 174 may include a metal, a conductive metal nitride, and/or a combination thereof. For example, the conductive barrier layer 174 may have a Ti/TiN stacked structure.

In the cell region, an insulating layer 130 may be formed around at least one of the plurality of bit line structures 148 and the insulating spacer structure 150. The insulating layer 130 may include a silicon oxide layer, a silicon nitride layer, a silicon oxynitride layer, and/or a combination thereof.

In the peripheral region, an insulating spacer structure 250 that covers sidewalls of the peripheral gate structure 148P may be formed. The insulating spacer structures 250 may include a first insulating spacer 252, a second insulating spacer 254, and a third insulating spacer 256. Materials included in the first to third insulating spacers 252 to 256 formed in the peripheral region may be the same as those included in the first to third insulating spacers 152 to 156 formed in the cell region, respectively, and the first to third insulating spacers 252 to 256 may be formed simultaneously or concurrently with the first to third insulating spacers 152 to 156.

In the peripheral region, an insulating layer 230 may be formed around the peripheral gate structure 148P and the insulating spacer structure 250. The insulating layer 230 may include a silicon oxide layer, a silicon nitride layer, a silicon oxynitride layer, and/or a combination thereof.

A mask pattern (not shown) may be formed on the insulating layer 230 of the peripheral region to cover a portion except for a region where the contact hole 270H is to be formed. Next, the contact hole 270H may be formed by etching a part of the insulating layer 230 using the mask pattern as an etching mask. The peripheral active region 119 may be exposed through the contact hole 270H. The operation of forming the contact hole 270H may be performed simultaneously or concurrently with the operation of forming the buried contact hole 170H in the cell region.

A conductive barrier layer 274 covering an inner wall of the contact hole 270H may be formed. The operation of forming the conductive barrier layer 274 may be performed simultaneously or concurrently with the operation of forming the conductive barrier layer 174 in the cell region. The conductive barrier layer 274 may include the same material as that of the conductive barrier layer 174 in the cell region.

A conductive line 280 may be formed by filling the conductive barrier layer 274 with a conductive material in the peripheral region. The landing pad 180 in the cell region and the conductive line 280 in the peripheral region may be formed simultaneously or concurrently using an identical material. The landing pad 180 and the conductive line 280 may be formed using a chemical vapor deposition (CVD) method and/or a physical vapor deposition (PVD) method. In some example embodiments, each of, or at least one of, the landing pad 180 and the conductive line 280 may include a metal, a metal nitride, a conductive polysilicon, and/or a combination thereof. For example, each of, or at least one of, the landing pad 180 and the conductive line 280 may include W.

FIGS. 15 through 27 are views of a method of manufacturing a semiconductor device in a process order, according to another example embodiment of inventive concepts.

For example, cell regions of FIGS. 15 through 27 are cross-sectional views taken along the lines A-A', lines B-B', and lines C-C' of FIG. 1. Furthermore, peripheral regions of FIGS. 15 through 27 are sectional views taken along the X-direction or the Y-direction of FIG. 1.

In FIGS. 15 through 27, like reference numerals in FIGS. 2 through 14 denote like elements, and a repeated description will not be given herein for simplicity.

Figure 15:
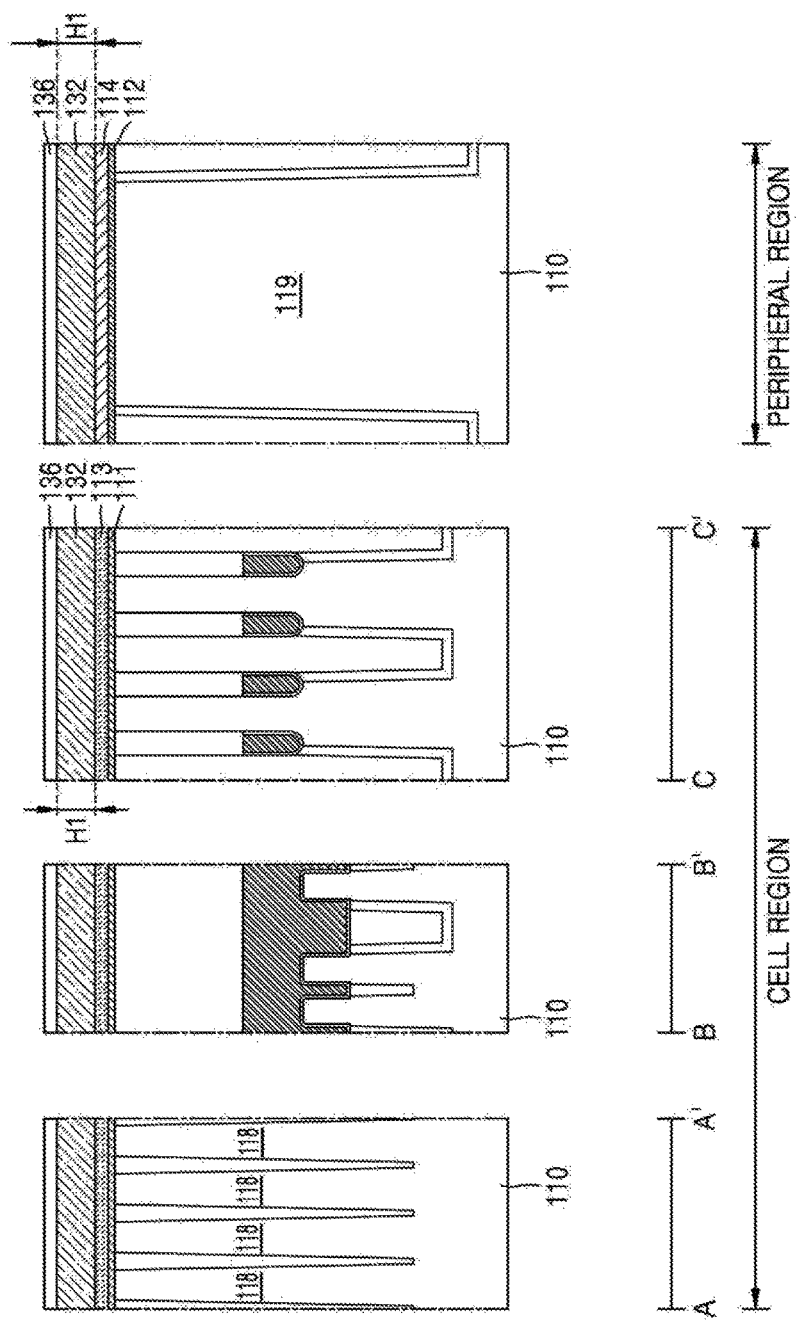
FIGS. 15 through 27 are views of a method of manufacturing a semiconductor device in a process order, according to another example embodiment of inventive concepts.

Referring to FIG. 15, the first insulating layer 111 may be formed in a cell region on the substrate 110, and the second insulating layer 112 may be formed in a peripheral region on the substrate 110. Thereafter, the third insulating layer 113 may be formed on the first insulating layer 111 in the cell region, and the fourth insulating layer 114 may be formed on the second insulating layer 112 in the peripheral region.

A cell insulating layer including the first and third insulating layers 111 and 113 may be formed in the cell region and a peripheral gate insulating layer including the second and fourth insulating layer 112 and 114 may be formed in the peripheral region.

In some example embodiments, a level of an upper surface of the cell insulating layer may be the same as that of an upper surface of the peripheral gate insulating layer. In some example embodiments, a level of an upper surface of the cell insulating layer may be different from that of an upper surface of the peripheral gate insulating layer.

Subsequently, the first conductive layer 132 may be formed on the cell insulating layer and the peripheral gate insulating layer to cover both the cell region and the peripheral region. The first conductive layer 132 may include, for example, a doped semiconductor material. In some example embodiments, the first conductive layer 132 may include doped polysilicon. The thickness H1 of the first conductive layer 132 may be the same in the cell region and the peripheral region.

Thereafter, the sacrificial layer 136 may be formed on the first conductive layer 132 to cover both the cell region and the peripheral region. The sacrificial layer 136 may include a material having a high etch selectivity with respect to the first conductive layer 132. For example, the sacrificial layer 136 may include a silicon oxide layer, a silicon nitride layer, a silicon oxynitride layer, and/or a combination thereof.

Figure 16:
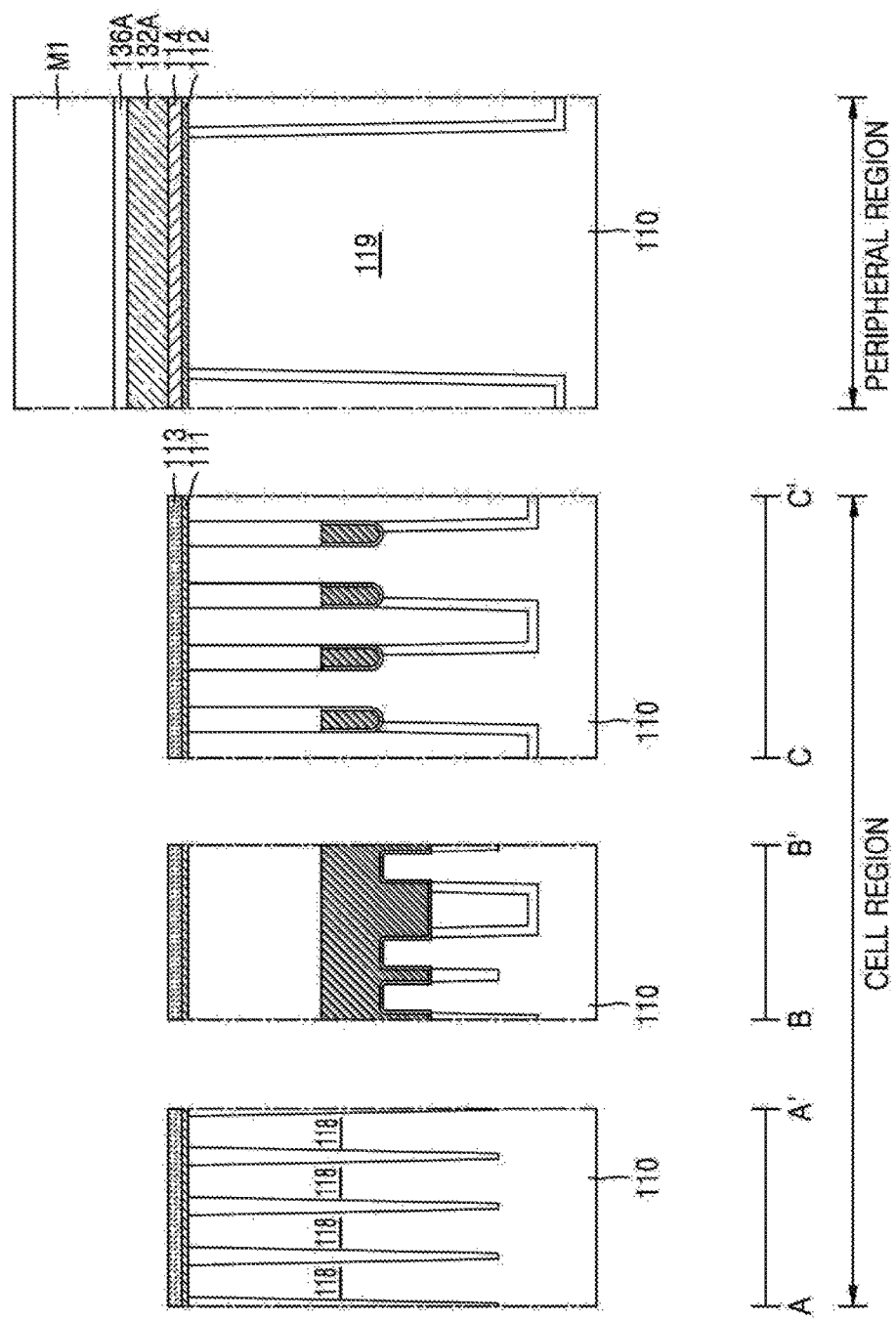

Referring to FIG. 16, the sacrificial pattern 136A and the first conductive pattern 132A may be formed in the peripheral region by respectively removing portions of the sacrificial layer 136 (see FIG. 15) that was formed in the cell region and the first conductive layer 132 (see FIG. 15) by performing a photolithography process.

In more detail, a photoresist may be coated on the sacrificial layer 136, and the photoresist is patterned by exposure and development to form the first photoresist pattern M1. The first photoresist pattern M1 may expose the upper surface of the sacrificial layer 136 in the cell region.

Subsequently, the sacrificial pattern 136A and the first conductive pattern 132A may formed on the peripheral region by etching the portions of the sacrificial layer 136 in the cell region and the first conductive layer 132 using the first photoresist pattern M1 as an etching mask, thereby exposing an upper surface of the insulating layer 113 in the cell region. Thereafter, the first photoresist pattern M1 may be removed using ashing and stripping processes. The ashing process may include plasma ashing with oxygen. The stripping process may include wet stripping with a solution included sulfuric acid and/or hydrogen peroxide. The removal process of the first photoresist pattern M1 may be performed under a condition wherein etching of the third insulating layer 113 is suppressed or reduced.

Figure 17:
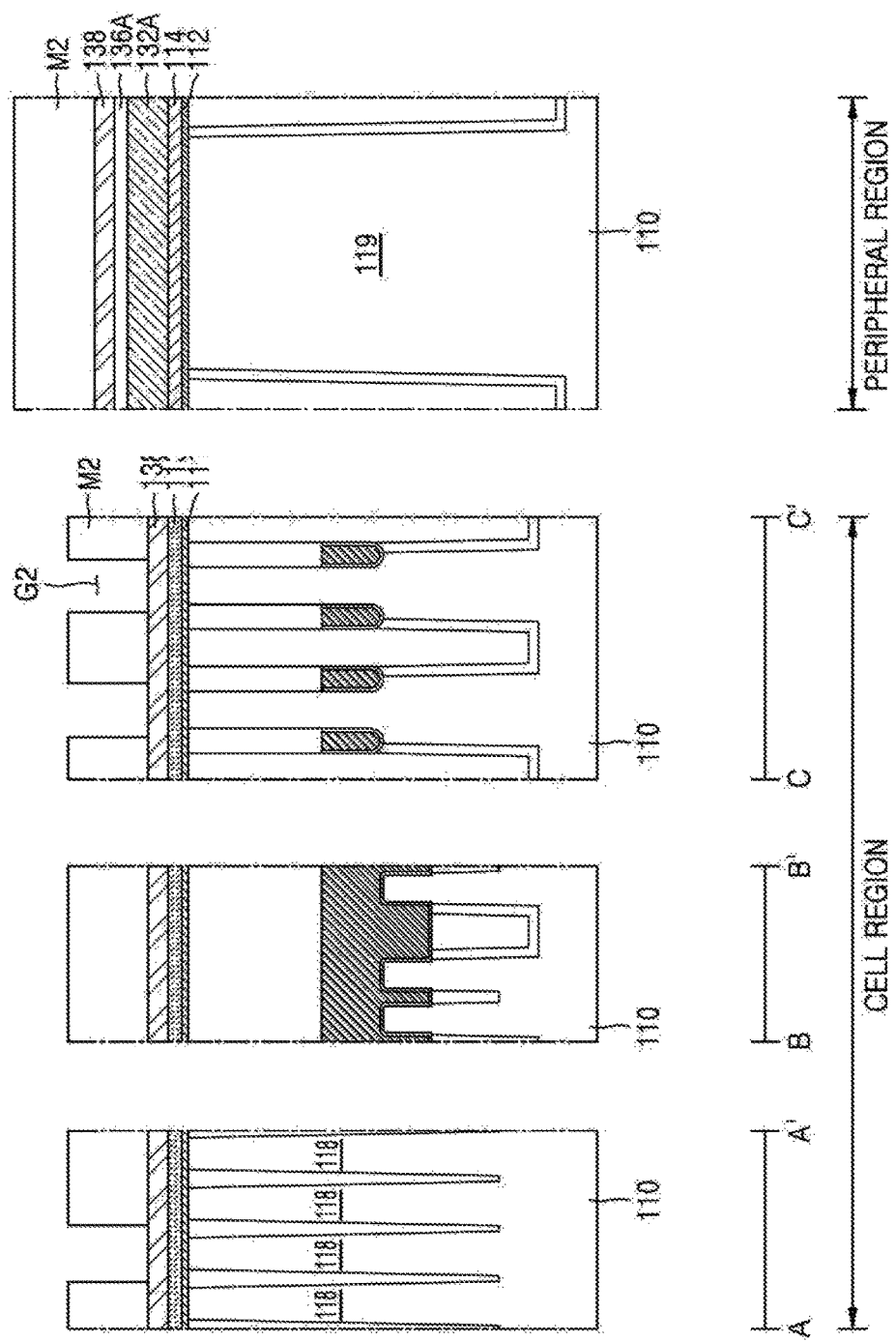

Referring to FIG. 17, the hard mask layer 138, which is in contact with the third insulating layer 113 in the cell region and the sacrificial pattern 136A in the peripheral region, may be formed to cover both the cell region and the peripheral region. Thereafter, the second photoresist pattern M2 may be formed on the hard mask layer 138.

A photoresist may be coated on the hard mask layer 138, and the photoresist is patterned by exposure and development to form the second photoresist pattern M2. The second photoresist pattern M2 may have the opening G2 for partially exposing the hard mask layer 138 in the cell region.

Figure 18:
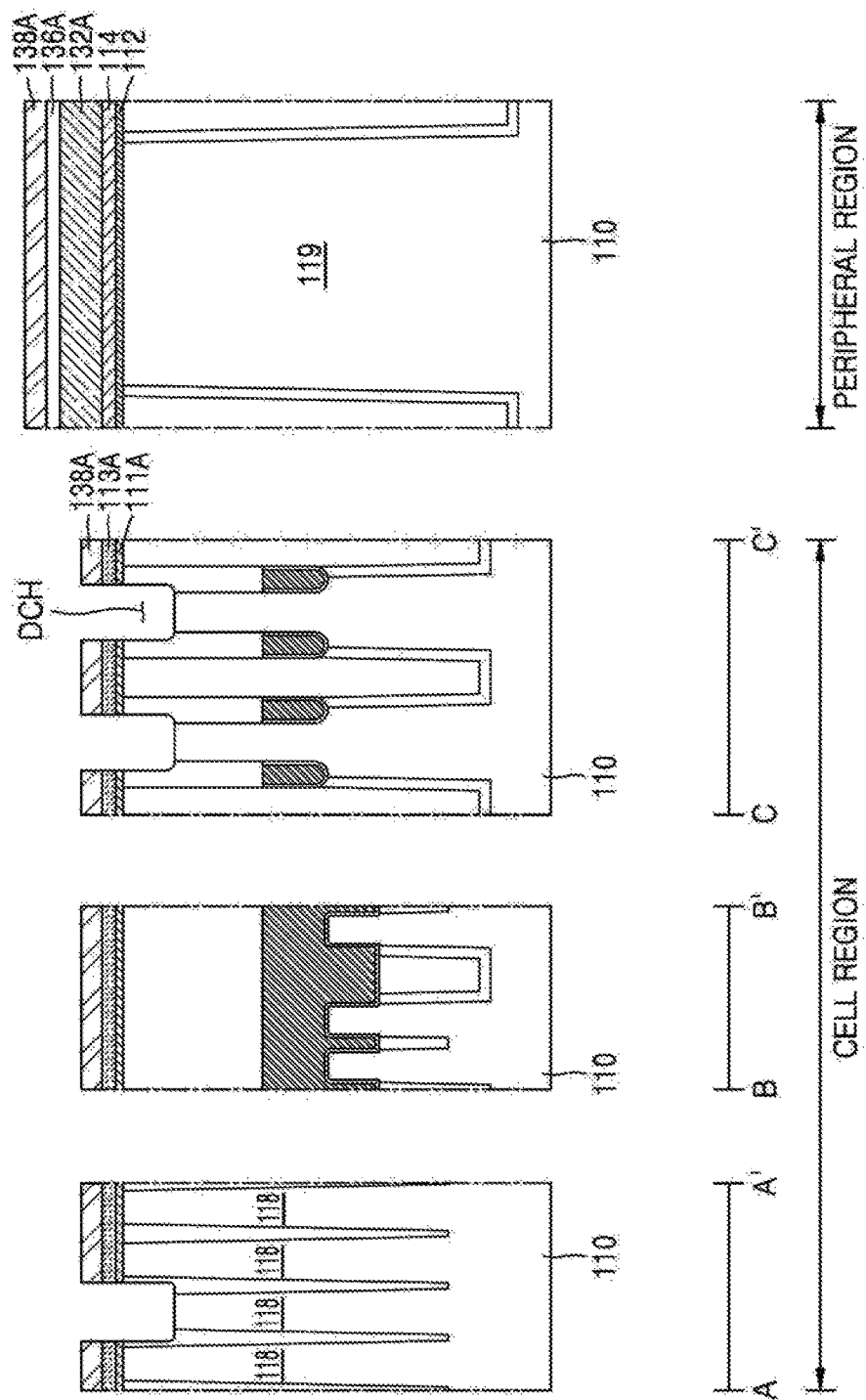

Referring to FIG. 18, a portion of the hard mask layer 138 (see FIG. 17) exposed through the opening G2 (see FIG. 17) of the second photoresist pattern M2 (see FIG. 17) is etched to form the hard mask pattern 138A. Thereafter, the third insulating layer 113 (see FIG. 17), the first insulating layer 111 (see FIG. 17), and a partial upper surface of the substrate 110 (see FIG. 17) may be etched using the hard mask pattern 138A as an etching mask.

As a result, the direct contact hole DCH which exposes the cell active region 118 of the substrate 110 in a cell region may be formed. Furthermore, the third insulating pattern 113A and the first insulating pattern 111A may be formed to define the direct contact hole DCH. In some example embodiments, a level of a lower surface of the direct contact hole DCH may be lower than that of an upper surface of the substrate 110. In some example embodiments, the partial upper surface of the substrate 110 may not be etched.

Figure 19:
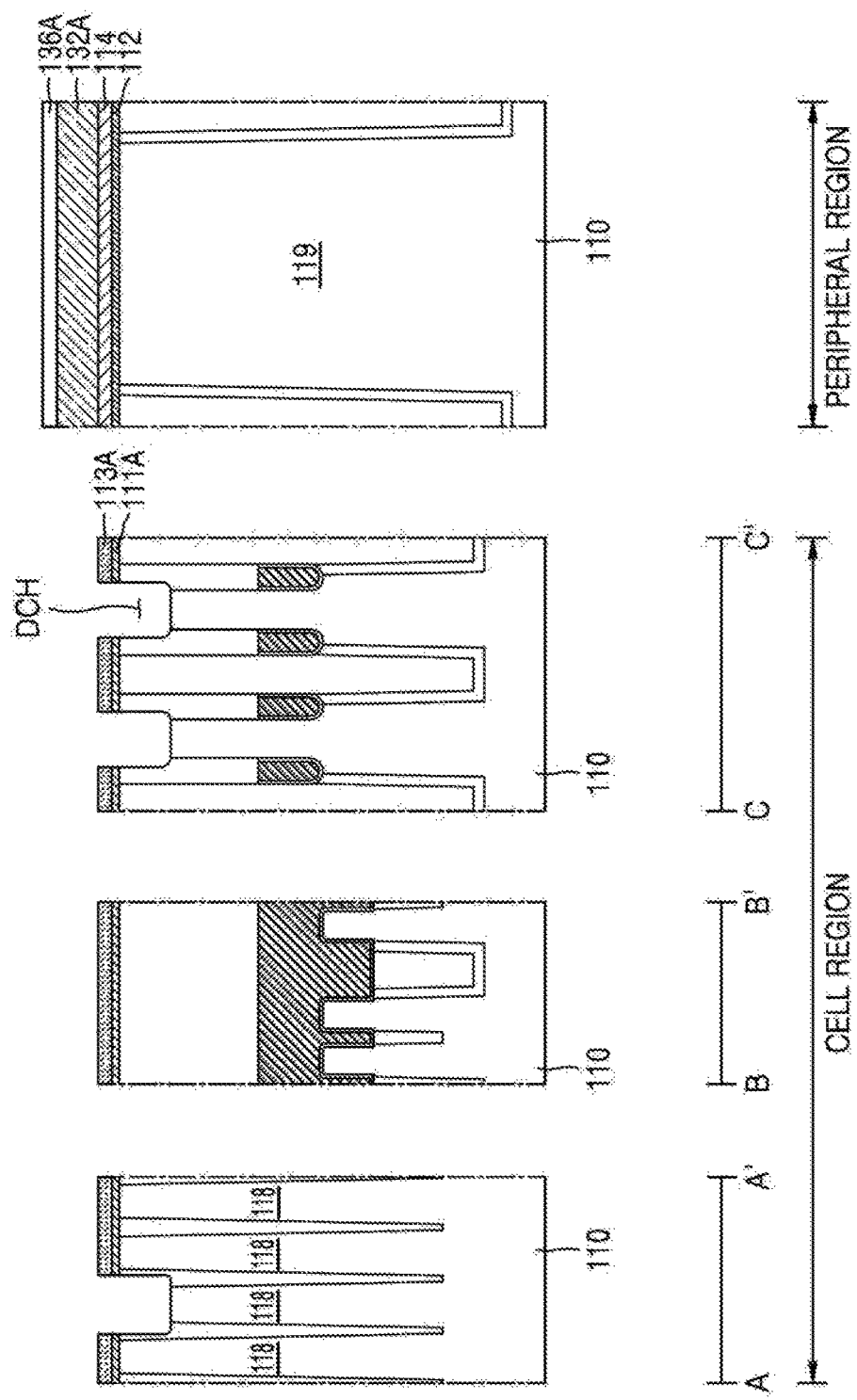

Referring to FIG. 19, the hard mask pattern 138A (see FIG. 18) may be removed from both the cell region and the peripheral region.

The hard mask pattern 138A may be removed using ashing and stripping processes. The ashing process may include plasma ashing with oxygen. The stripping process may include wet stripping with a solution included sulfuric acid and/or hydrogen peroxide. In addition, the removal process of the hard mask pattern 138A may be performed under a condition wherein etching of the third insulating pattern 113A and the sacrificial pattern 136A is suppressed or reduced.

Figure 20:
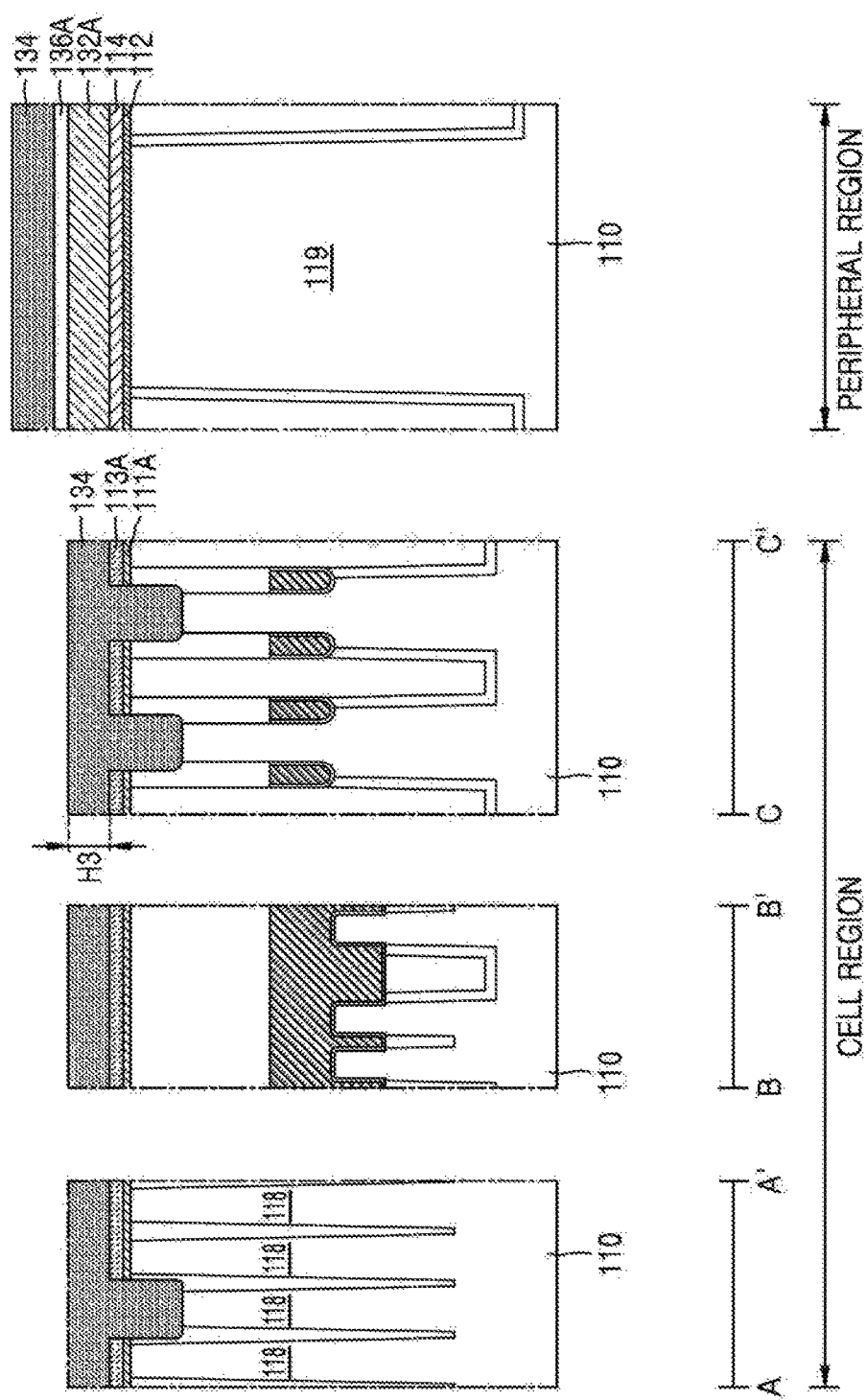

Referring to FIG. 20, after all direct contact holes DCH (see FIG. 19) are filled to form direct contacts DC, the second conductive layers 134 are respectively formed to cover upper surfaces of the third insulating pattern 113A and the sacrificial pattern 136A. The second conductive layers 134 may be formed consecutively with, or in-situ with, the forming of the direct contacts DC. The second conductive layers 134 may be formed and the direct contacts DC may be formed with a CVD process, for example, a PECVD process; however, inventive concepts are not limited thereto.

The second conductive layers 134 may include, for example, a doped semiconductor material. In some example embodiments, the second conductive layer 134 may include doped polysilicon. A thickness H3 of the second conductive layer 134 may be the same in the cell region and the peripheral region.

The second conductive layer 134 may have a shape in which a first region filling the direct contact hole DCH to be connected to the cell active region 118 and a second region uniformly covering an upper surface of the third insulating pattern 113A and an upper surface of the first region are integrated; for example, the first region filling the direct contact hole DCH and the second region uniformly covering the upper surface of the third insulating pattern 113A may be formed simultaneously or concurrently, or may be contiguous.

Figure 21:
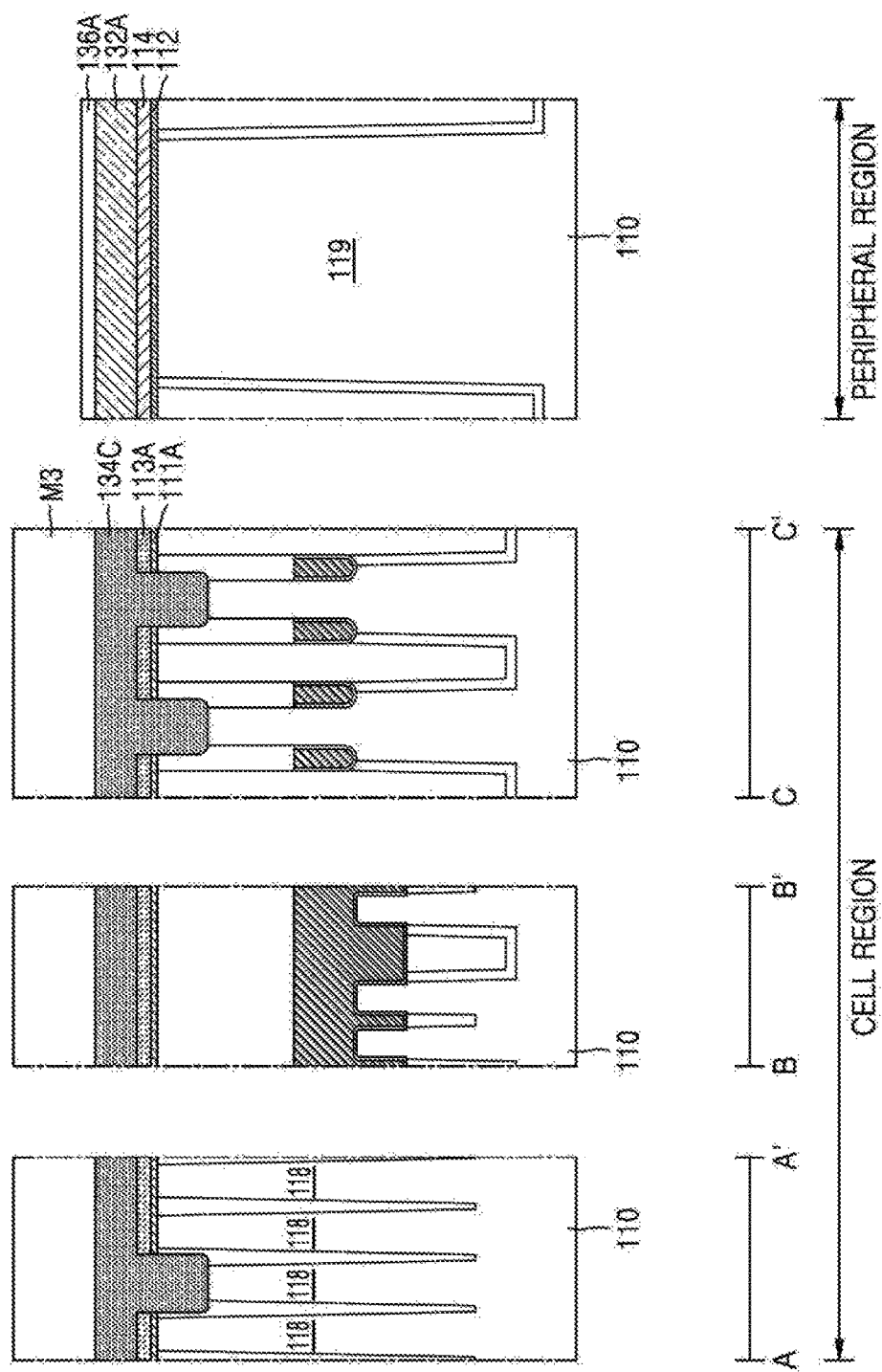

Referring to FIG. 21, a portion of the second conductive layer 134 (see FIG. 20) that was formed in a peripheral region may be removed through a photolithography process to form a second conductive pattern 134C in a cell region.

For example, a photoresist may be coated on the second conductive layer 134, and the photoresist is patterned by exposure and development to form the third photoresist pattern M3. The third photoresist pattern M3 may expose an upper surface of the second conductive layer 134 in the peripheral region.

Subsequently, the second conductive pattern 134C may be formed on the cell region by etching the portion of the second conductive layer 134 in the peripheral region using the third photoresist pattern M3 as an etching mask, thereby exposing an upper surface of the sacrificial pattern 136A. Thereafter, the third photoresist pattern M3 may be removed using ashing and stripping processes. The ashing process may include plasma ashing with oxygen. The stripping process may include wet stripping with a solution included sulfuric acid and/or hydrogen peroxide.

Figure 22:
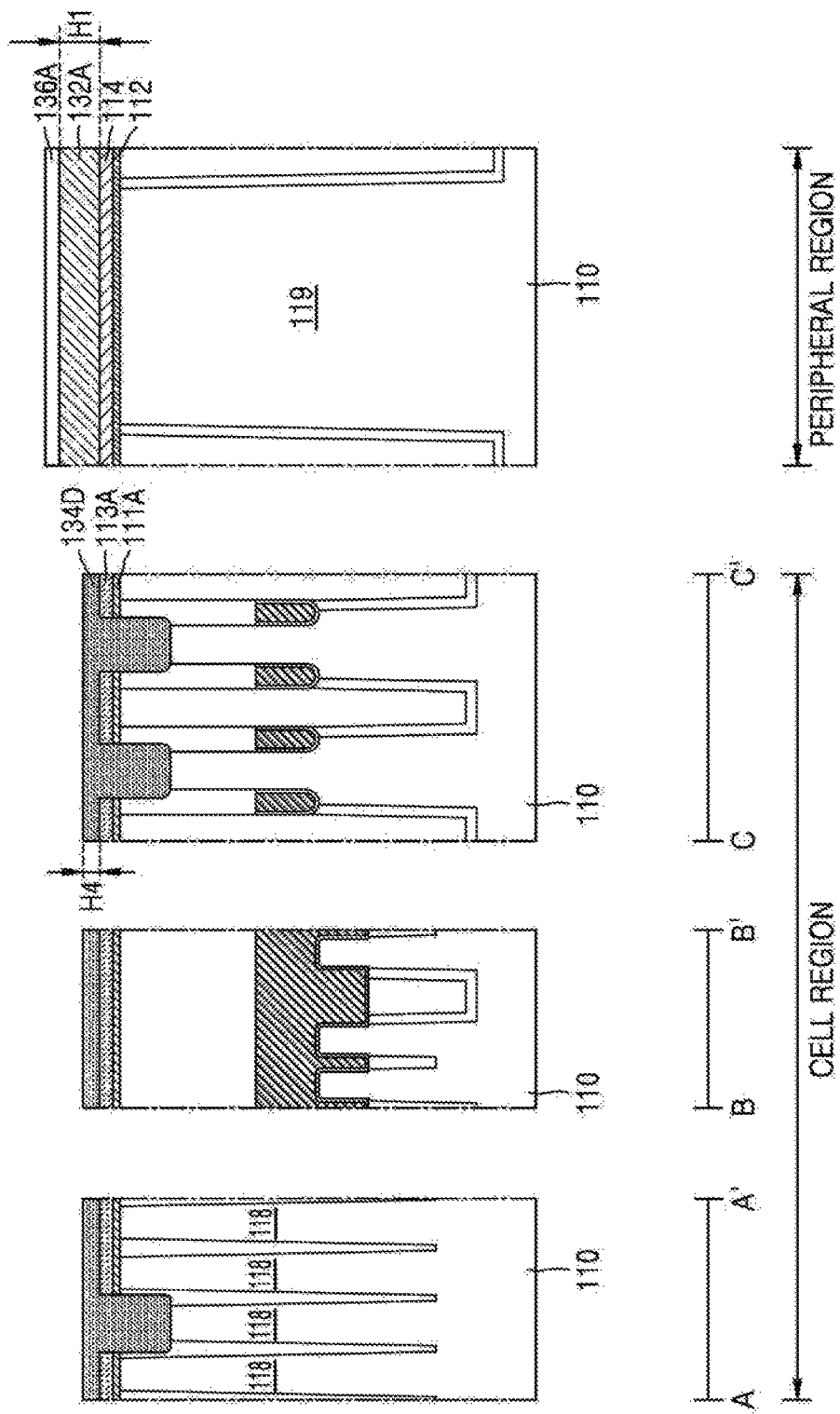

Referring to FIG. 22, a second conductive pattern, which is thinner than an initial state (hereinafter, referred to as a second thin conductive pattern 134D), including a direct contact may be formed by entirely etching a surface of the second conductive pattern 134C (see FIG. 21).

The surface etching process leaves the second thin conductive pattern 134D in a cell region using an etch-back method, for example a blanket etch method, and/or a CMP method. The sacrificial pattern 136A protects the first conductive pattern 132A in a peripheral region during the entire-surface etching process.

A part of an upper portion of the second conductive pattern 134C may be removed from the cell region through the entire-surface etching process so that the second thin conductive pattern 134D having a thickness less than the second conductive pattern 134C may be formed. For example, a thickness H4 of the second thin conductive pattern 134D may be less than the thickness H3 (see FIG. 20) of the second conductive pattern 134C.

Figure 23:
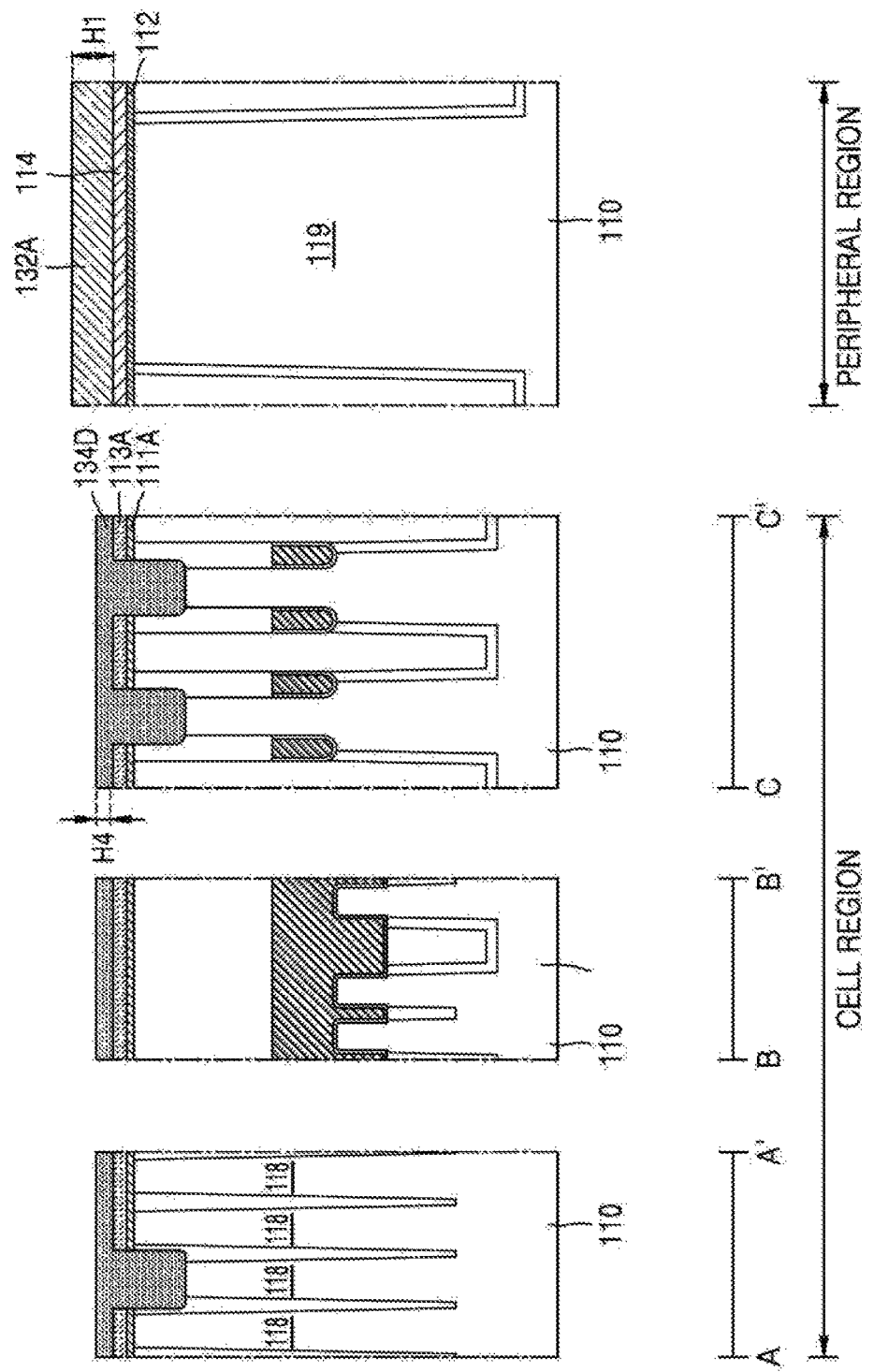

Referring to FIG. 23, the sacrificial pattern 136A (see FIG. 22) on the first conductive pattern 132A may be removed from a peripheral region.

In a process of forming the second thin conductive pattern 134D in a cell region, the peripheral region may be covered by a mask such as the sacrificial pattern 136A, and the sacrificial pattern 136A may be removed from the peripheral region after the second thin conductive pattern 134D is formed in the cell region.

In some example embodiments, the sacrificial pattern 136A may be removed by wet etching, for example, wet etching with a solution including hydrogen fluoride. The removal process of the sacrificial pattern 136A may be performed under a condition wherein etching of the second thin conductive pattern 134D in the cell region is suppressed or reduced.

The second thin conductive pattern 134D may have a shape in which a first region filling the direct contact hole DCH (see FIG. 19) to be connected to the cell active region 118 and a second region uniformly covering an upper surface of the third insulating pattern 113A and an upper surface of the first region are integrated; for example, the first region filling the direct contact hole DCH and the second region uniformly covering the upper surface of the third insulating pattern 113A may be formed simultaneously or concurrently, or may be contiguous.

As a result, the thickness H1 of the first conductive pattern 132A in the peripheral region may be greater than the thickness H4 of the second thin conductive pattern 134D in the cell region. For example, a level of an upper surface of the first conductive pattern 132A in the peripheral region may be higher than that of an upper surface of the second thin conductive pattern 134D in the cell region.

Accordingly, a second region of the second thin conductive pattern 134D in the cell region may form a part of a bit line 141 (see FIG. 26) in a subsequent process, and the first conductive pattern 132A in the peripheral region may include at least a part of the peripheral gate conductive pattern and may form a part of a peripheral gate structure 141P (see FIG. 26), and thus may achieve vertical step down of one of the plurality of bit lines 141 in the cell region while maintaining a height of the peripheral gate structure 141P in the peripheral region.

Accordingly, only the second thin conductive pattern 134D exists in the cell region and only the first conductive pattern 132A exists in the peripheral region. In some example embodiments, the second thin conductive pattern 134D may include at least one dopant of P and As at a doping concentration of from about 1E19 to about 1E22 atoms/cm$^3$, and the first conductive pattern 132A may include at least one dopant of P, As, and B at a doping concentration of from about 1E14 to about 1E17 atoms/cm$^3$. The second conductive layer 134 may be formed with dopants deposited in-situ with the deposition of the second conductive layer 134. Additionally or alternatively, dopants may be implanted into the second conductive layer 134. However, inventive concepts are not limited thereto. Thermal processes, including rapid thermal processing (RPT) processes, may be performed to convert the second conductive layer 134 from an amorphous state to a polycrystalline state and/or to activate the dopants included in the second conductive layer 134. One of the plurality of bit lines 141 and the peripheral gate structure 141P may be respectively formed using polysilicon having different doping concentrations.

Figure 24:
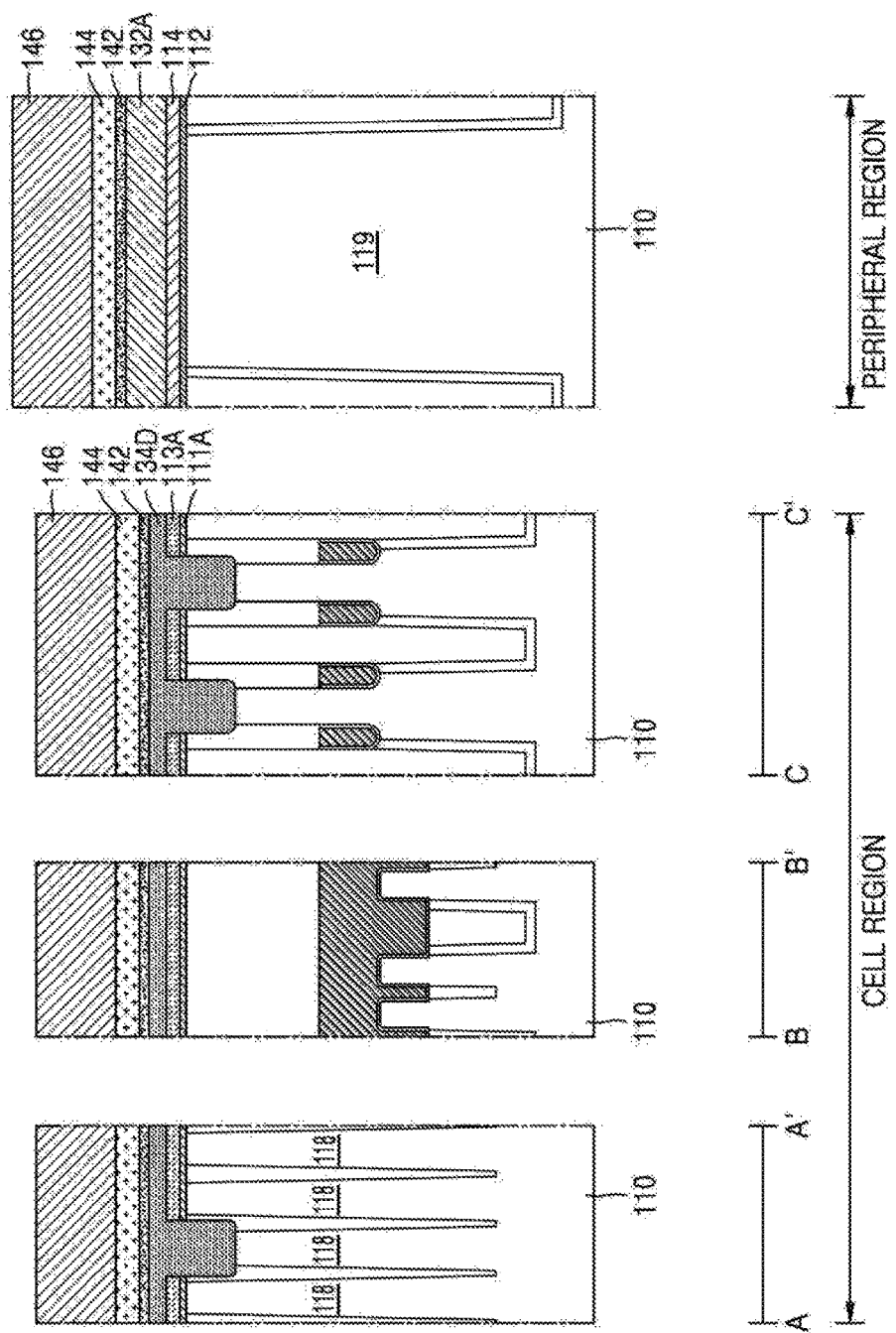

Referring to FIG. 24, the metal layer 143 covering the second thin conductive pattern 134D in a cell region and covering the first conductive pattern 132A in a peripheral region may be formed. Thereafter, the insulating capping layer 146 may be formed on the metal layer 143.

In some example embodiments, the metal layer 143 may be or include a stacked structure of the lower metal layer 142 and the upper metal layer 144. FIG. 24 shows that the metal layer 143 has the stacked structure of a double conductive layer including the lower metal layer 142 and the upper metal layer 144, however, inventive concepts is not limited thereto. For example, the metal layer 143 may be formed as a monolayer or a stacked structure of three or more layers.

Figure 25:
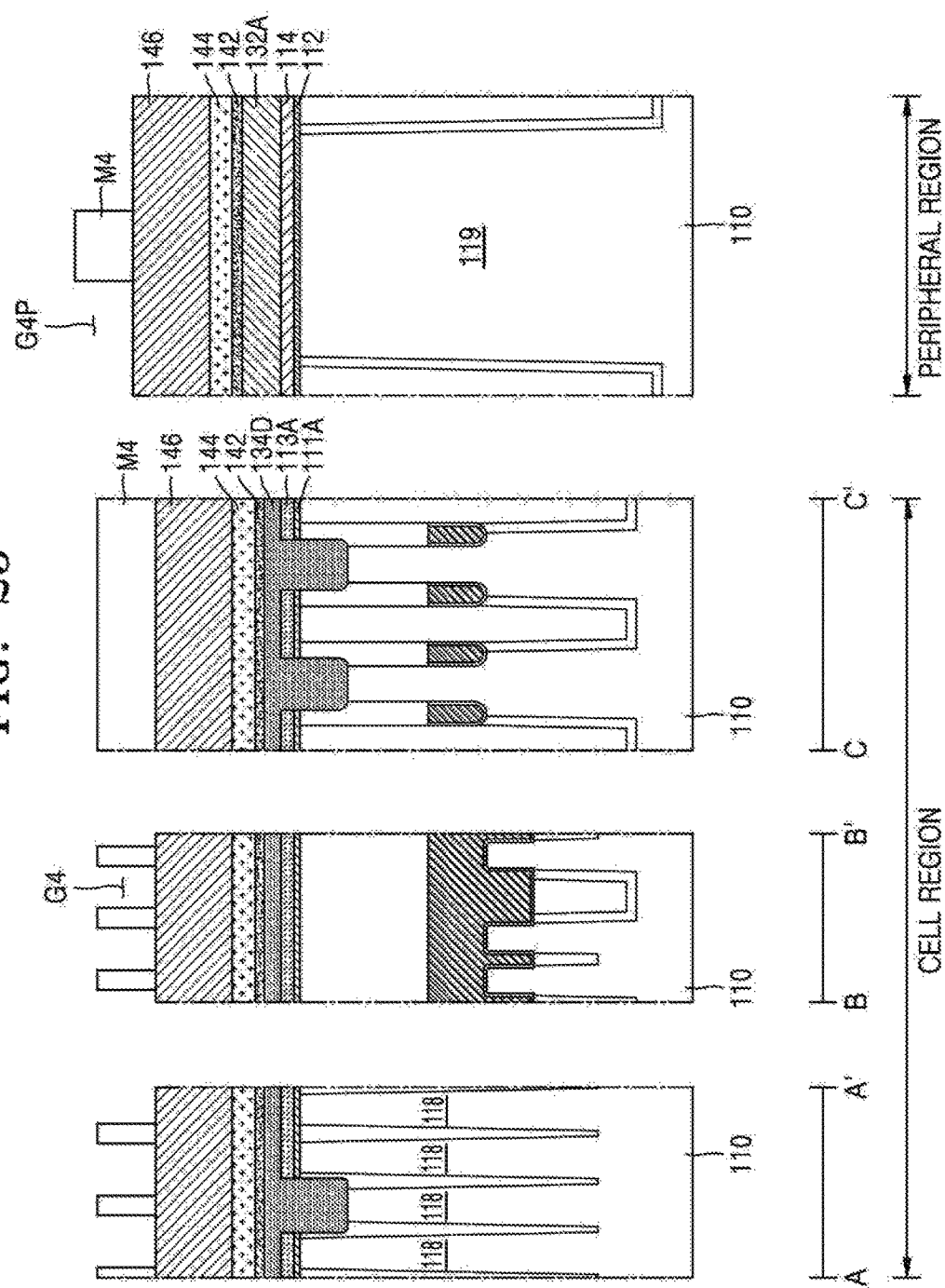

Referring to FIG. 25, a fourth photoresist pattern M4 may be formed on the insulating capping layer 146.

A photoresist may be coated on the insulating capping layer 146, and the photoresist is patterned by exposure and development to form the fourth photoresist pattern M4. The fourth photoresist pattern M4 may have an opening G4 for partially exposing the insulating capping layer 146 in a cell region and an opening G4P for partially exposing the insulating capping layer 146 in a peripheral region.

Figure 26:
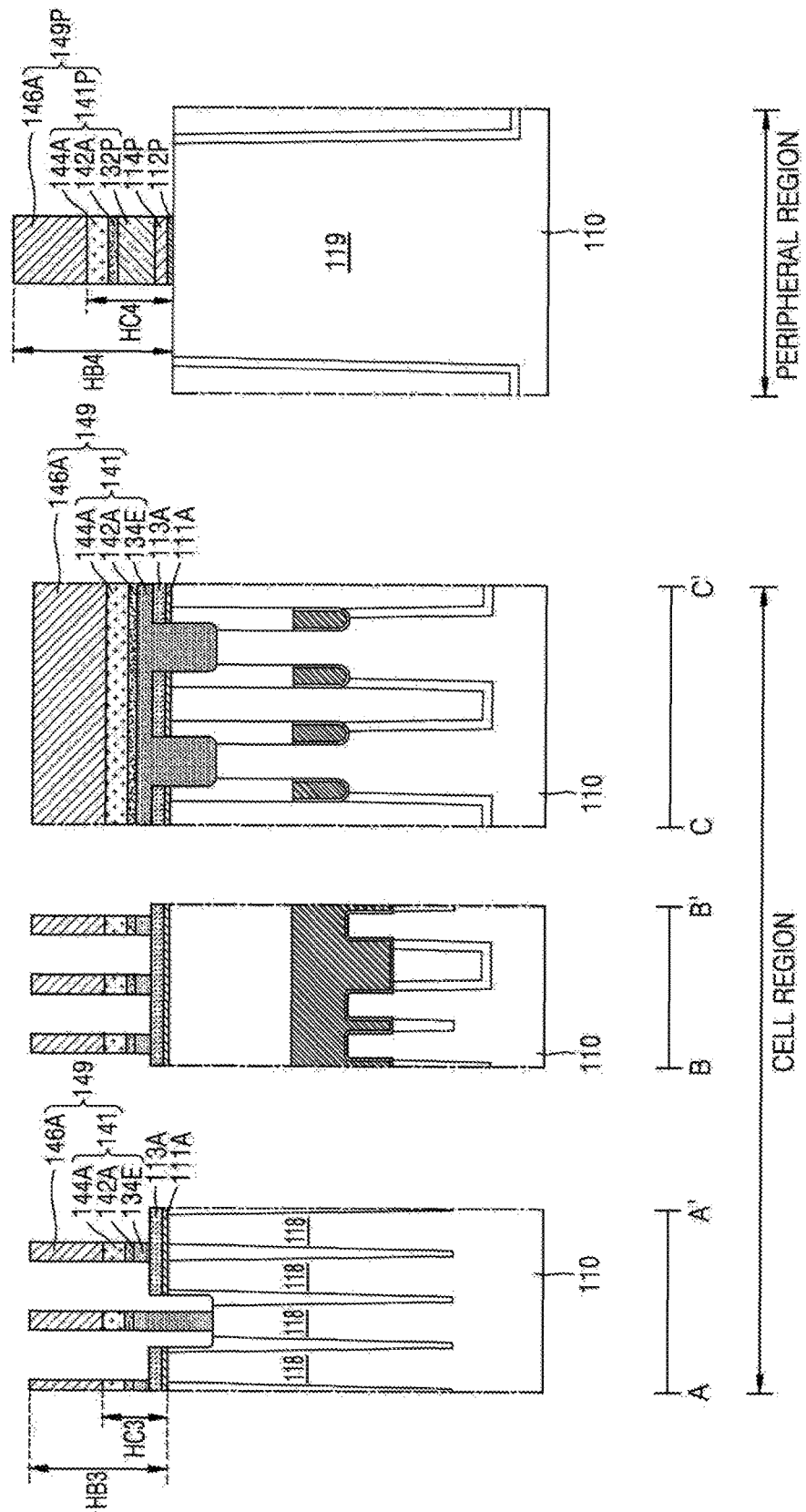

Referring to FIG. 26, a bit line structure 149 in a cell region and a peripheral gate structure 149P in a peripheral region may be formed on the substrate 110.

For example, a plurality of bit lines 141 including a second conductive line, which is thinner than an initial state (hereinafter, referred to as a second thin conductive line 134E), a lower metal line 142A, and an upper metal line 144A in a line shape may be formed in the cell region by etching the second thin conductive pattern 134D (see FIG. 25), the lower metal layer 142 (see FIG. 25), the upper metal layer 144 (see FIG. 25), and the insulating capping layer 146 (see FIG. 25) using the fourth photoresist pattern M4 (see FIG. 25) as an etching mask. Thereafter, a plurality of insulating capping lines 146A may be formed on the plurality of bit lines 141.

Furthermore, a plurality of peripheral gate electrodes 141P including the first conductive line 132P, the lower metal line 142A, and the upper metal line 144A in a line shape may be formed in the peripheral region by etching the first conductive pattern 132A (see FIG. 25), the lower metal layer 142, the upper metal layer 144, and the insulating capping layer 146 by using the fourth photoresist pattern M4 as an etching mask, and the plurality of insulating capping lines 146A may be formed on the plurality of peripheral gate electrodes 141P.

One of the plurality of bit lines 141 and one of the insulating capping lines 146A may form the bit line structure 149.

The plurality of bit lines 140 may include the second thin conductive line 134E including a direct contact formed of doped polysilicon, but may also have a relatively thin vertical stacked structure. A height HC3 of the plurality of bit lines 141 from the substrate 110 to the top surface may be relatively lower than a height HC4 of the peripheral gate structure 141P from the substrate 110 to the top surface.

For example, a height HB3 of the plurality of bit line structures 149 including the plurality of bit lines 141 from the substrate 110 to the top surface may be greater than a height HB4 of the peripheral gate structure 149P from the substrate 110 to the top surface.

At least one of peripheral gate insulating patterns, the peripheral gate electrodes 141P, and the insulating capping lines 146A may form the peripheral gate structure 149P.

Accordingly, a level of an upper surface of the second thin conductive line 134E including the bit line structure 149 formed in the cell region may be lower than a level of an upper surface of the first conductive line 132P of the peripheral gate structure 149P formed in the peripheral region, and thus the height HC3 of one of the plurality of bit lines 141 from the substrate 110 to the top surface may be reduced, or reduced relative to the height HC4 of the peripheral gates. This effectively reduces parasitic capacitance that may occur or exist between one of the plurality of buried contacts 170 (see FIG. 27) and one of the plurality of bit lines 141 due to leaning (or collapsing) defects of the bit lines 141, stray electric fields, and/or a subsequent process of the bit line structure 149. The height HC4 of the peripheral gate structure may be desired to be relatively high, to control the work-function and/or depletion ratios of the peripheral gate structure. The height HC3 of one of the plurality of bit lines 141 may be desired to be relatively lower to reduce parasitic capacitance and/or electric fields between one of the plurality of bit lines 141 and the one of the plurality of buried contacts 170.

According to inventive concepts, reliability of a semiconductor device and productivity of a manufacturing process of the semiconductor device may be improved.

Figure 27:
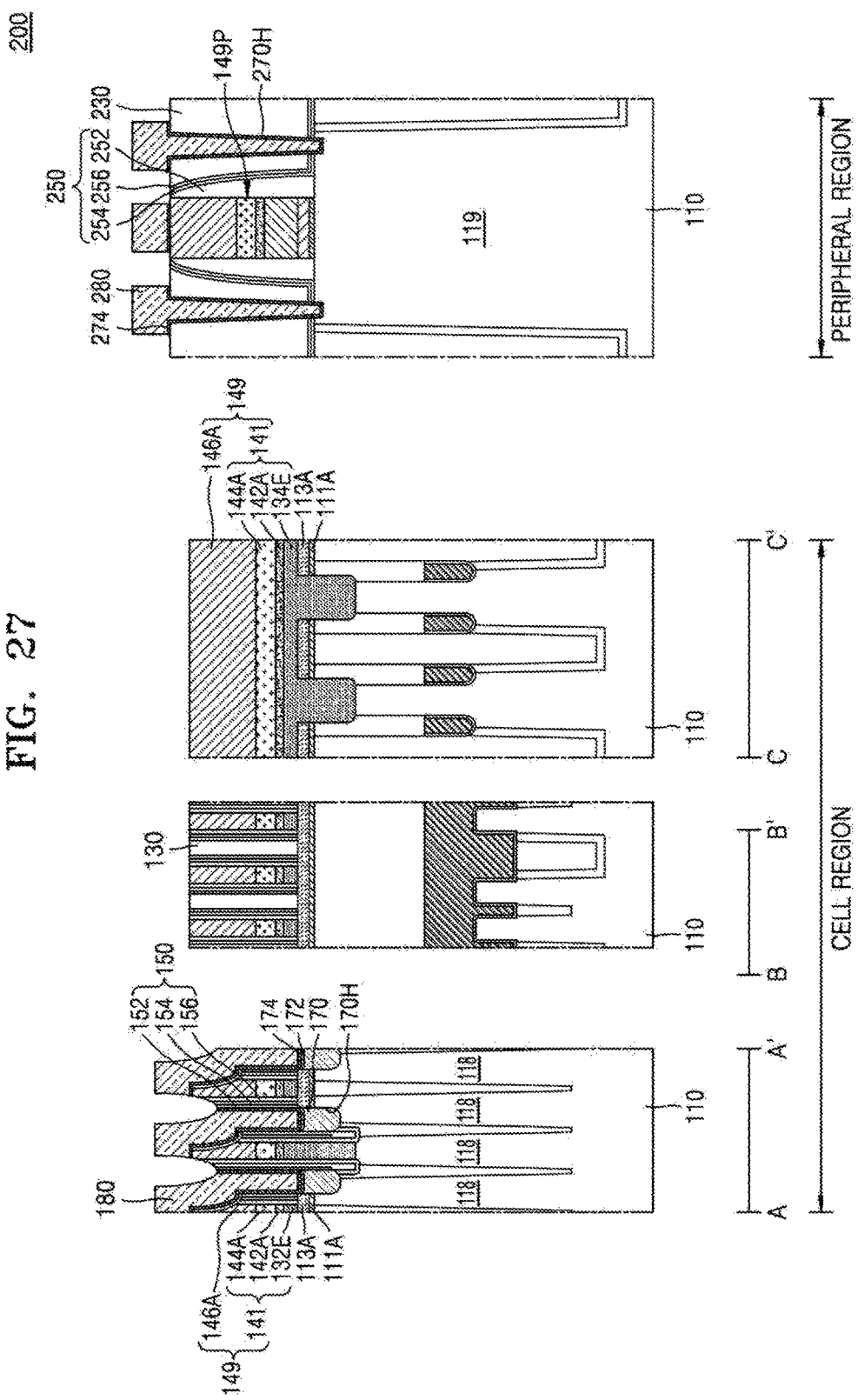

Referring to FIG. 27, the semiconductor device 200 including the plurality of bit line structures 149 in a cell region and a plurality of peripheral gate structures 149P in a peripheral region may be formed.

Figure 28:
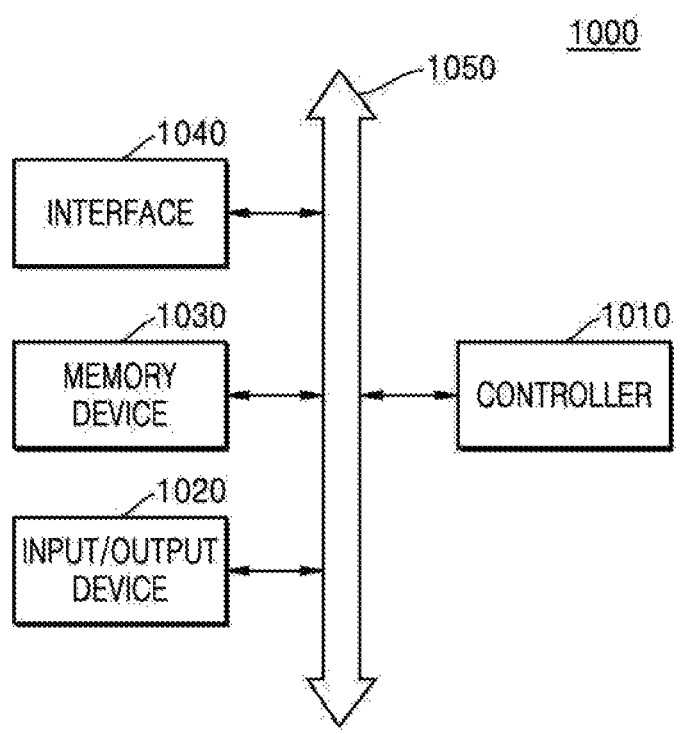
FIG. 28 is a configuration diagram of a system including a semiconductor device, according to example embodiments of inventive concepts.

FIG. 28 is a configuration diagram of a system 1000 including a semiconductor device, according to example embodiments of inventive concepts.

Referring to FIG. 28, the system 1000 may include a controller 1010, an input/output device 1020, a memory device 1030, an interface 1040, and a bus 1050.

The system 1000 may be or may include an electronic system. The system 1000 may be or may include a mobile system or a system for transmitting and receiving information. In some example embodiments, the mobile system may be or may include a portable computer (PC), a web tablet, a mobile phone, a digital music player, or a memory card.

The controller 1010, to control an executable program of the system 1000, may be formed of a microprocessor, a digital signal processor, a microcontroller, or similar devices.

The input/output device 1020 may be used to input and output data of the system 1000. The system 1000 may be connected to an external device, for example, a PC or a network by using the input/output device 1020, and may exchange data with the external device. The input/output device 1020 may be or may include, for example, a touch pad, a keyboard, or a display.

The memory device 1030 may store data for an operation of the controller 1010 or data processed in the controller 1010. The memory device 1030 may include any one of the semiconductor devices 100 and 200 according to the above-described example embodiments of inventive concepts.

The interface 1040 may be or may include a data transmission path between the system 1000 and the external device. The controller 1010, the input/output device 1020, the memory device 1030, and the interface 1040 may communicate with each other via a bus 1050.

While inventive concepts has been particularly shown and described with reference to example embodiments thereof, it will be understood that various changes in form and details may be made therein without departing from the spirit and scope of the following claims.

What is claimed is:

1. A semiconductor device comprising:
a substrate including a cell active region and a peripheral active region;
a direct contact on a cell insulating pattern formed on the substrate and connected to the cell active region;
a bit line structure extending in one direction and including a thin conductive pattern contacting a side surface of the direct contact; and
a peripheral gate structure in the peripheral active region, the peripheral gate structure including,
a stacked structure of a peripheral gate insulating pattern, and
a peripheral gate conductive pattern, wherein
the thin conductive pattern and the peripheral gate conductive pattern includes a first material,
a level of an upper surface of the thin conductive pattern is lower than a level of an upper surface of the peripheral gate conductive pattern, and
a level of an upper surface of the cell insulating pattern is equal to a level of an upper surface of the peripheral gate insulating pattern.

2. The semiconductor device of claim 1, wherein the direct contact includes a first semiconductor material having a first doping concentration and the thin conductive pattern includes a second semiconductor material having a second doping concentration.

3. The semiconductor device of claim 2, wherein the direct contact includes at least one dopant of phosphorus (P) and arsenic (As) at a doping concentration of from about 1E19 to about 1E22 atoms/ cm$^3$, and the thin conductive pattern includes at least one dopant of P, As, and boron (B) at a doping concentration of from about 1E14 to about 1E17 atoms/ cm$^3$.

4. The semiconductor device of claim 1, wherein the thin conductive pattern includes a second semiconductor material including at least one first dopant and the peripheral gate conductive pattern includes the second semiconductor material, and a doping concentration of the at least one first dopant in the thin conductive pattern is identical to the doping concentration of the at least one first dopant in the peripheral gate conductive pattern.

5. The semiconductor device of claim 1, wherein a level of an upper surface of the direct contact is equal to a level of an upper surface of the thin conductive pattern.

6. The semiconductor device of claim 1, wherein a level of an upper surface of the direct contact is lower than a level of an upper surface of the peripheral gate conductive pattern.

7. The semiconductor device of claim 1, wherein the bit line structure includes a metallic conductive pattern and an insulating capping layer on the thin conductive pattern, and the peripheral gate structure includes a metallic conductive pattern and an insulating capping layer on the peripheral gate conductive pattern.

8. The semiconductor device of claim 7, wherein a level of a top surface of the metallic conductive pattern of the bit line structure is lower than that of a top surface of the metallic conductive pattern of the peripheral gate structure.

9. The semiconductor device of claim 1, wherein a level of an upper surface of the bit line structure is lower than that of an upper surface of the peripheral gate structure.

10. A semiconductor device comprising:
a substrate including a cell active region and a peripheral active region;
a cell insulating pattern in the cell active region, the cell insulating pattern including a direct contact hole;
a thin conductive pattern, in which a first region filling the direct contact hole and a second region uniformly covering an upper surface of the cell insulating pattern and an upper surface of the first region are contiguous;
a bit line including the second region and extending in one direction in the cell active region; and
a peripheral gate electrode in the peripheral active region and including a peripheral gate conductive pattern, wherein
a level of a top surface of the bit line is lower than a level of a top surface of the peripheral gate electrode,
the thin conductive pattern includes a semiconductor material including at least one dopant of phosphorus (P) and arsenic (As) at a doping concentration of from about 1E19 to about 1E22 atoms/ cm$^3$, and
the peripheral gate conductive pattern includes a semiconductor material including at least one dopant of P, As, and boron (B) at a doping concentration of from about 1E14 to about 1E17 atoms/ cm$^3$.

11. The semiconductor device of claim 10, wherein the bit line includes a metallic conductive pattern on the thin conductive pattern, and the peripheral gate electrode includes a metallic conductive pattern on the peripheral gate conductive pattern.

12. The semiconductor device of claim 10, wherein a level of an upper surface of the cell insulating pattern is equal to a level of an upper surface of the first region.

13. The semiconductor device of claim 10, further comprising:
a peripheral gate insulating pattern and a work-function control pattern between the substrate and the peripheral gate conductive pattern.

14. A system comprising:
a bus;
a controller configured to communicate on the bus and configured to control an executable program; and
the semiconductor device of claim 1.

15. A semiconductor device comprising:
a substrate including a cell active region and a peripheral active region;
a direct contact on a cell insulating pattern formed on the substrate and connected to the cell active region;
a bit line structure extending in one direction and including a thin conductive pattern contacting a side surface of the direct contact; and
a peripheral gate structure in the peripheral active region, the peripheral gate structure including a stacked structure of a peripheral gate insulating pattern and a peripheral gate conductive pattern, wherein the thin conductive pattern and the peripheral gate conductive pattern include a first material, a level of an upper surface of the thin conductive pattern is lower than a level of an upper surface of the peripheral gate conductive pattern, and a level of an upper surface of the direct contact is equal to a level of an upper surface of the thin conductive pattern.

16. A system comprising:

a bus;

a controller configured to communicate on the bus and configured to control an executable program; and the semiconductor device of claim 10.

17. A system comprising:

a bus;

a controller configured to communicate on the bus and configured to control an executable program; and the semiconductor device of claim 15.

\* \* \* \* \*